(12) United States Patent
Lee et al.

(10) Patent No.: US 7,851,920 B2
(45) Date of Patent: Dec. 14, 2010

(54) WIRE STRUCTURE, METHOD FOR FABRICATING WIRE, THIN FILM TRANSISTOR SUBSTRATE, AND METHOD FOR FABRICATING THIN FILM TRANSISTOR SUBSTRATE

(75) Inventors: Je-hun Lee, Seuol (KR); Chang-oh Jeong, Suwon-si (KR); Beom-seok Cho, Seoul (KR); Yang-ho Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 11/486,720

(22) Filed: Jul. 15, 2006

(65) Prior Publication Data

US 2007/0013078 A1 Jan. 18, 2007

(30) Foreign Application Priority Data

Jul. 15, 2005 (KR) ...................... 10-2005-0064483

(51) Int. Cl.
H01L 23/48 (2006.01)
(52) U.S. Cl. ............................ 257/762; 257/E23.161
(58) Field of Classification Search ............... 257/687, 257/762
See application file for complete search history.

(56) References Cited

U.S. PATENT DOCUMENTS

| 6,219,125 | B1* | 4/2001 | Ishikura et al. ............. 349/147 |
| 6,518,630 | B2 | 2/2003 | You et al. |
| 6,624,073 | B2* | 9/2003 | Sun et al. ..................... 438/687 |
| 7,157,323 | B2* | 1/2007 | Gan et al. ..................... 438/197 |
| 2004/0125257 | A1 | 7/2004 | Chae et al. |
| 2004/0232443 | A1* | 11/2004 | Cho et al. ..................... 257/202 |
| 2006/0110866 | A1* | 5/2006 | Gan et al. ..................... 438/151 |
| 2006/0144686 | A1 | 7/2006 | Yada et al. |
| 2006/0269729 | A1* | 11/2006 | Gan et al. .................... 428/209 |

FOREIGN PATENT DOCUMENTS

| CN | 1167420 A | 12/1997 |
| CN | 1610859 A | 4/2005 |
| JP | 2000-208773 | 7/2000 |
| KR | 10-2005-002564 | 1/2005 |
| KR | 10-2005-003246 | 1/2005 |

OTHER PUBLICATIONS

English Language Abstract, Publication No. JP200208773, Jul. 28, 2000, 1 p.
Korean Patent Abstracts, Publication No. 1020050002564, Jan. 7, 2005, 1 p.
Korean Patent Abstracts, Publication No. 1020050003246, Jan. 10, 2005, 1 p.

* cited by examiner

*Primary Examiner*—Steven Loke
*Assistant Examiner*—Kimberly M Thomas
(74) *Attorney, Agent, or Firm*—Innovation Counsel LLP

(57) ABSTRACT

Provided are a wire structure, a method for fabricating a wire, a thin film transistor (TFT) substrate, and a method for fabricating a TFT substrate. The wire structure includes a barrier layer formed on a substrate and including copper nitride and a copper conductive layer formed on the barrier layer and including copper or a copper alloy.

7 Claims, 29 Drawing Sheets

WIRE STRUCTURE, METHOD FOR FABRICATING WIRE, THIN FILM TRANSISTOR SUBSTRATE, AND METHOD FOR FABRICATING THIN FILM TRANSISTOR SUBSTRATE

BACKGROUND OF THE INVENTION

This application claims priority from Korean Patent Application No. 10-2005-0064483, filed on Jul. 15, 2005, in the Korean Intellectual Property Office, the disclosure of which is incorporated herein in its entirety by reference.

1. Field of the Invention

The present invention relates to a wire structure, and more particularly, to a wire structure including copper (Cu) or a copper alloy, a method for fabricating a wire, a thin film transistor (TFT) substrate, and a method for fabricating the TFT substrate.

2. Description of the Related Art

A thin film transistor (TFT) substrate is used as a substrate for a liquid crystal display (LCD) having pixels in a matrix array and an organic electro luminescence (EL) display.

An LCD, which is one of the most widely used flat panel displays, includes two substrates having a plurality of electrodes and a liquid crystal layer interposed therebetween and adjusts the amount of light transmitted therethrough by applying a voltage to the electrodes to rearrange liquid crystal molecules in the liquid crystal layer. In the LCD, thin film transistors are used as switching elements for controlling picture signals applied to the respective electrodes.

An organic electroluminescence (EL) display device displays a picture by electrically exciting phosphorescent organic material, and includes a driving TFT for supplying pixels with current necessary for light emission and a switching TFT.

As the display area of the LCD or the organic EL display device increases, the gate lines and the data lines connected to the TFTs also grow longer, causing an increase in the resistance of a wire. To solve a signal delay problem resulting from the increase in the resistance, the gate lines and the data lines should be formed of a material having as low a resistivity as possible.

In addition, for improvement of the reliability of the wire, the wire is requested to have good adhesion and to be patterned with a good profile.

SUMMARY OF THE INVENTION

The present invention provides a thin film transistor (TFT) substrate having a copper wire structure that exhibits improved adhesion and superior lateral profile. The present invention also provides a method for fabricating the TFT substrate.

According to an aspect of the present invention, there is provided a wire structure that includes a barrier layer formed on a substrate preferably including copper nitride and a copper conductive layer formed on the barrier layer and including copper or a copper alloy.

According to another aspect of the present invention, there is provided a method for fabricating a wire, the method including forming a barrier layer including copper nitride on a substrate, forming a copper conductive layer including copper or a copper alloy on the barrier layer, forming a capping layer including molybdenum or a molybdenum alloy on the copper conductive layer; and patterning the capping layer, the copper conductive layer, and the barrier layer using a photoresist pattern defining the wire as an etching mask.

According to still another aspect of the present invention, there is provided TFT substrate including gate wires and a gate line extending in a first direction, a gate electrode connected to the gate line on an insulating substrate, data wires insulated from the gate wires, a data line extending in a second direction and intersecting the gate line, a source electrode connected to the data line, a drain electrode spaced apart from the source electrode on the insulating substrate, and a pixel electrode formed for each pixel and connected to the drain electrode on the gate wires and the data wires, wherein the gate wires and/or the data wires include a barrier layer formed on a substrate and including copper nitride and a copper conductive layer formed on the barrier layer and including copper or a copper alloy.

According to a further aspect of the present invention, there is provided a method for fabricating a thin film transistor (TFT) substrate, the method including forming gate wires including a gate line extending in a first direction and a gate electrode connected to the gate line on an insulating substrate, forming data wires insulated from the gate wires and including a data line extending in a second direction and intersecting the gate line, a source electrode connected to the data line, and a drain electrode spaced apart from the source electrode on the insulating substrate, and forming a pixel electrode connected to the drain electrode for each pixel on the gate wires and the data wires, wherein the formation of the gate wires and/or the data wires includes forming a barrier layer including copper nitride on a substrate, forming a copper conductive layer including copper or a copper alloy on the barrier layer, forming a capping layer including molybdenum or a molybdenum alloy on the copper conductive layer, and patterning the capping layer, the copper conductive layer, and the barrier layer using a photoresist pattern defining the wire as an etching mask.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
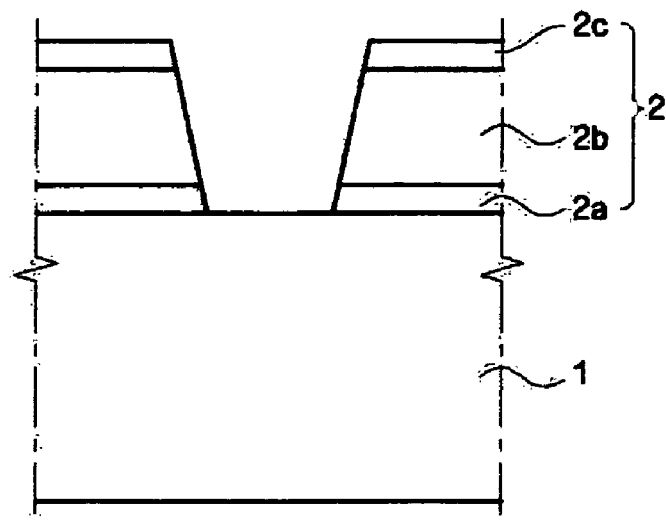
FIG. 1 is a sectional view showing a wire structure according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, a wire structure and a method for fabricating a wire according to an embodiment of the present invention will be described with reference to accompanying drawings.

Figure 2:
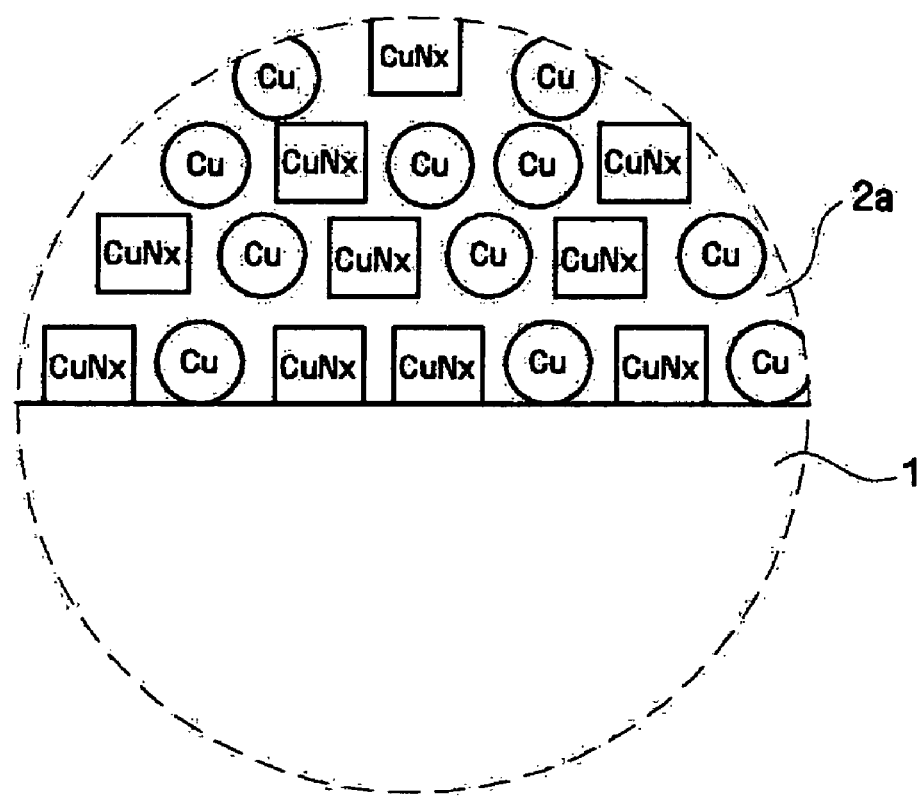
FIG. 2 illustrates the interfacial contact of a wire structure according to an embodiment of the present invention formed on a substrate.

FIG. 1 is a sectional view showing a wire structure according to an embodiment of the present invention, and FIG. 2 illustrates the interfacial contact of a wire structure and a substrate according to an embodiment of the present invention.

Among various wire materials, copper (Cu) is cheap and has relatively low resistivity. Cu has resistivity of approximately 1.67 $\mu\Omega$cm, which is much lower than that of aluminum (Al), i.e., approximately 2.65 $\mu\Omega$cm. Therefore, in an actual process, a gate line or a data line made of Cu significantly improves the signal delay problem compared to an Al-based gate or data line.

However Cu is poor in adhesion to an underlying substrate, such as an insulating substrate made of, for example, glass, or a semiconductor substrate, so that it tends to peel off or lift. In addition, since Cu is poor in chemical resistance to chemical substances, it is easily oxidized or corroded when exposed to the chemical substances in a subsequent process. Thus, a multi-layered wire including a lower barrier layer and an upper capping layer may be used.

Referring to FIG. 1, a wire structure according to an embodiment of the present invention comprises a substrate 1 and a wire 2 including a barrier layer 2a, copper conductive layer 2b and a capping layer 2c. The barrier layer 2a including copper nitride (CuN) is interposed between the substrate 1 and the copper conductive layer 2b. The capping layer 2c is formed on the copper conductive layer 2b.

The lower substrate 1 provides a surface where a wire 2 is formed and supports the wire. The substrate 1 may comprise a single structure having a single component element layer, as well as a complex structure having a combination of multiple components, elements, layers or the like. The substrate 1 may be, for example, without limitation, an insulator substrate made of glass, a semiconductor layer made of amorphous silicon, or an insulation layer.

The copper conductive layer 2b including copper or a copper alloy is formed on the substrate 1. Copper exhibits low resistivity, i.e., 2.1 $\mu\Omega$cm, in a thin film state and is preferably used as a good wiring material.

The barrier layer 2a including copper nitride (CuN) is positioned between the substrate 1 and the copper conductive layer 2b. The barrier layer 2a improves adhesion between the copper conductive layer 2b and the substrate 1 and prevents copper ions from diffusing into the substrate 1. Copper is prone to lifting or peeling while the copper conductive layer 2b is deposited and patterned due to its poor adhesion to the substrate 1. However, since the barrier layer 2a includes copper nitride, adhesion is improved by copper nitride, thereby avoiding lifting or peeling.

Here, since copper nitride (CuN) is a copper based material, it exhibits relatively good adhesion to Cu compared to other material. In addition, copper nitride offers several advantages, for example, simplifying the fabrication process such as deposition, etching or the like. Further, since the ratio of etching selectivity to Cu forming an upper layer is low and an etching speed of copper nitride is similar to that of Cu, batch-type etching can be advantageously performed and a good profile can be obtained. Examples of copper nitride include, but are not limited to, $Cu_3N$.

Referring to FIG. 2, since copper nitride (CuN) in the barrier layer 2a has better adhesion than copper in an interface between the barrier layer 2a and the substrate 1, the adhesion of the copper conductive layer 2b can be improved by positioning copper nitride in the interface between the barrier layer 2a and the substrate 1. The copper nitride need not necessarily be present continuously in the interface. When copper nitride is present discontinuously, adhesion between copper nitride and copper can still be ensured to an extent, and will be effective to prevent copper diffusion into substrate 1. Barrier layer 2a maintains a characteristic of the substrate 1, e.g., a semiconductor layer, by preventing copper ions from diffusing into the substrate. On the other hand, the barrier layer 2a prevents the resistivity of the copper conductive layer 2b from increasing by preventing a material of the substrate 1 from diffusing into the copper conductive layer 2b. Thus, the barrier layer 2a preferably includes copper nitride in an amount enough to prevent copper diffusion. The amount of nitrogen in the barrier layer 2a may be in a range of 0.001-50 atomic percent, and the amount of copper nitride in the barrier layer 2a may depend on the atomic percent of the nitrogen.

Referring back to FIG. 1, the thickness of the barrier 2a can be adjusted according to the amount of copper nitride contained in the barrier layer 2a, i.e., the atomic percent of nitrogen. For example, when the atomic percent of nitrogen is high, the thickness of the barrier layer 2a may be small. However, when the atomic percent of nitrogen is low, the thickness of the barrier layer 2a should be sufficiently large. Moreover, as the amount of copper nitride in the interface between the barrier layer 2a and the substrate 1 increases, the thickness of the barrier layer 2a may be made smaller. Theoretically, when copper nitride is present continuously in the interface, an appropriate level of adhesion can be obtained with a barrier layer 2a thickness equal to that of an atom or molecule. In reality, however, it is quite difficult to form a continuous interface with copper nitride only. From a viewpoint of a characteristic of the substrate 1, it is often advantageous to discontinuously form the barrier layer 2a in order to impart some conductivity to the barrier layer 2a. In addition, for a better diffusion preventing function, the barrier layer 2a should have a minimum thickness. In the light of the above, the thickness of the barrier layer 2a may be adjusted in a range of 50 to 1000 Å.

When the barrier layer 2a and the copper conductive layer 2b are formed continuously, an interface between them may be indistinct. In this case, the amount of copper nitride may be considered as a criterion for dividing the barrier layer 2a and the copper conductive layer 2b. In other words, if a section shows sufficient conductivity although it includes a small amount of copper nitride, it may be included in the copper conductive layer 2b. On the other hand, although a section having the same level as the section includes a large amount of copper nitride and its specific narrow section does not nearly have copper nitride, if the portion functions as the barrier layer 2a, it may be included in the barrier layer 2a. Thus, the thickness of the barrier layer 2a is an average throughout all sections without considering a small variance from section to section.

A capping layer 2c is formed on the copper conductive layer 2b to prevent certain areas of the copper conductive layer 2b from being corroded through reaction to the chemical etchants used to pattern the copper conductive layer 2b by oxidization. Indiscriminate corrosion of the conductive copper layer would undesirably increase its resistivity. Thus, a capping layer 2c is positioned on the copper conductive layer 2b to prevent the copper conductive layer 2b from being directly exposed to the etchant. Suitable examples of materials that can be used in the capping layer 2c include Mo and Mo alloys such as MoW, MoTi, MoNb, MoZr, MoTa, MoIn, and so on. In the absence of a subsequent etching step or step resulting in a corrosion problem, formation of the capping layer 2c may be omitted.

Figure 3:
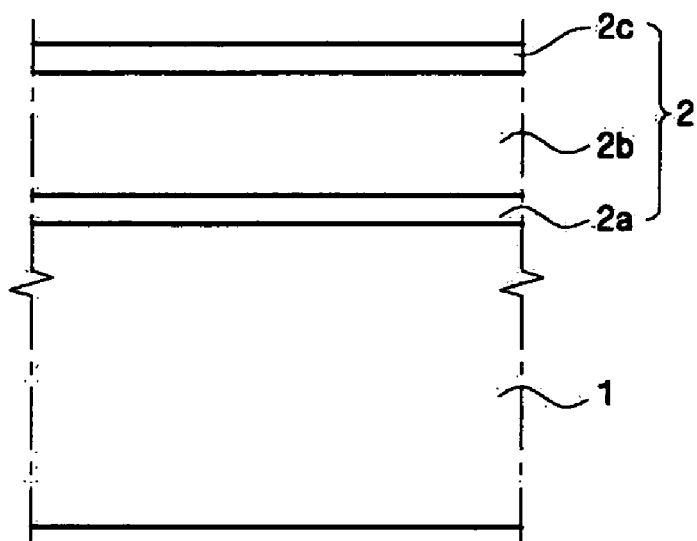
FIGS. 3 and 4 are sectional views illustrating processing steps of a method for fabricating a wire according to an embodiment of the present invention.
Figure 4:
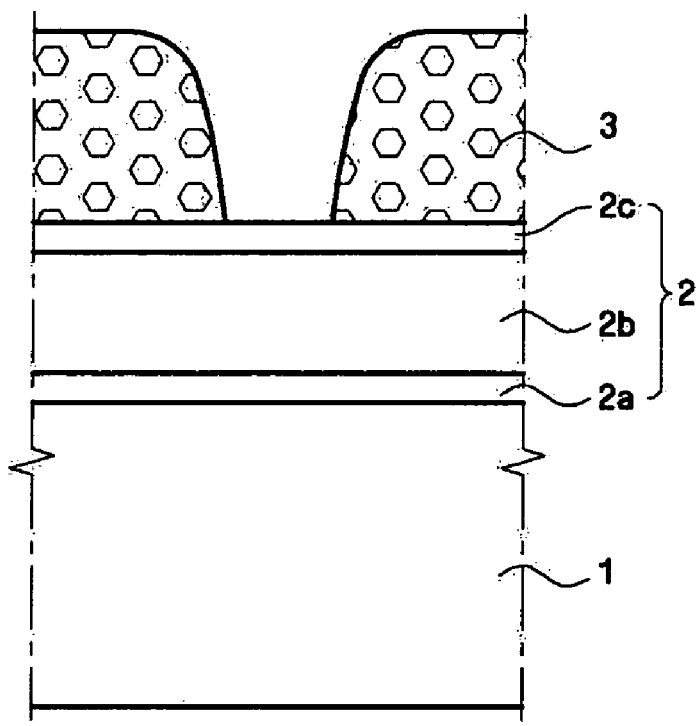

Next, a method for fabricating a wire having the wire structure stated above will be described with reference to FIGS. 1, 3, and 4. FIGS. 3 and 4 are sectional views illustrating processing steps of a method for fabricating a wire according to an embodiment of the present invention.

Referring to FIG. 3, the substrate 1 such as an insulating substrate formed of glass, a semiconductor layer, or an insulating layer is provided. Substrate 1 may be subjected to sputtering using a copper or a copper alloy target in an atmosphere that includes nitrogen. The atmosphere may also include argon (Ar) in addition to nitrogen. When argon gas, which is an inactive gas, collides with a Cu target in a plasma state, Cu is separated from the target and is deposited on the substrate 1. The nitrogen gas reacts with Cu to form copper nitride as the barrier layer 2a. The barrier layer 2a facilitates adhesion and prevents diffusion of copper. Some target elements do not react with nitrogen gas, but there are several types of target elements that may be used to constitute barrier layer 2a, including copper nitride. Some copper atoms colliding with argon gas and some copper atoms colliding with nitrogen gas may not react with the nitrogen gas.

Argon gas and nitrogen gas contained in the sputtering chamber may be in a ratio of 90:10~40:60. The content of nitrogen is preferably maintained at a high level at an initial sputtering stage and gradually decreases with the content of Argon increasing. Then, a large amount of copper nitride may deposit from the surface of the substrate 1 to upper, i.e., in the vicinity of the interface between the substrate 1 and the barrier layer 2a. The farther from the interface, the smaller the content of the copper nitride in the barrier layer 2a. The content of nitrogen in the barrier layer 2a may range from 0.001 to 50 atomic percent. A thickness of the barrier layer 2a may be adjusted in a range of 50 to 1000 Å.

Next, the copper conductive layer 2b is formed by depositing copper or a copper alloy on the barrier layer 2a using sputtering. This step may be performed continuously with its previous step of forming the barrier layer 2a in an in-situ manner. More specifically, the step may be performed in the same chamber as in its previous step while the supply of nitrogen gas is interrupted and the amount of Ar gas is increased. To distinguish the barrier layer 2a from the copper conductive layer 2b, the supply of nitrogen gas is interrupted and then the nitrogen gas is purged with a short ventilation period, followed by performing sputtering on the copper conductive layer 2b. The thickness of the copper conductive layer 2b may be in a range of 1000-3000 Å, preferably, 1500-2500 Å.

Next, the capping layer 2c is formed on the copper conductive layer 2b by sputtering using Ar gas. A material that is etched away in a batch process together with a copper-based material forming the underlying copper conductive layer 2b and the barrier layer 2a, that is, a material that has a small selectivity, is advantageously used and suitable examples thereof include Mo and Mo alloy. Specific examples of the useful capping layer 2c include Mo, MoW, MoTi, MoNb, MoZr, MoTa, MoIn, and so on. In such a way, formation of a three-layered structure having the barrier layer 2a, copper conductive layer 2b and the capping layer 2c is completed.

Referring to FIG. 4, the capping layer 2c, the copper conductive layer 2b, and the barrier layer 2a may be selectively etched away using a photoresist pattern 3 as an etching mask. Using wet etching, the capping layer 2c, the copper conductive layer 2b, and the barrier layer 2a may be etched in a batch process using the same etchant because they have low etching selectivity. Hydroperoxide or nitric acid based etchant may be used as the etchant and phosphoric acid or acetic acid may further be included in the etchant. When the photoresist pattern 3 is removed, wire 2, as shown in FIG. 1, is formed.

Figure 5A:
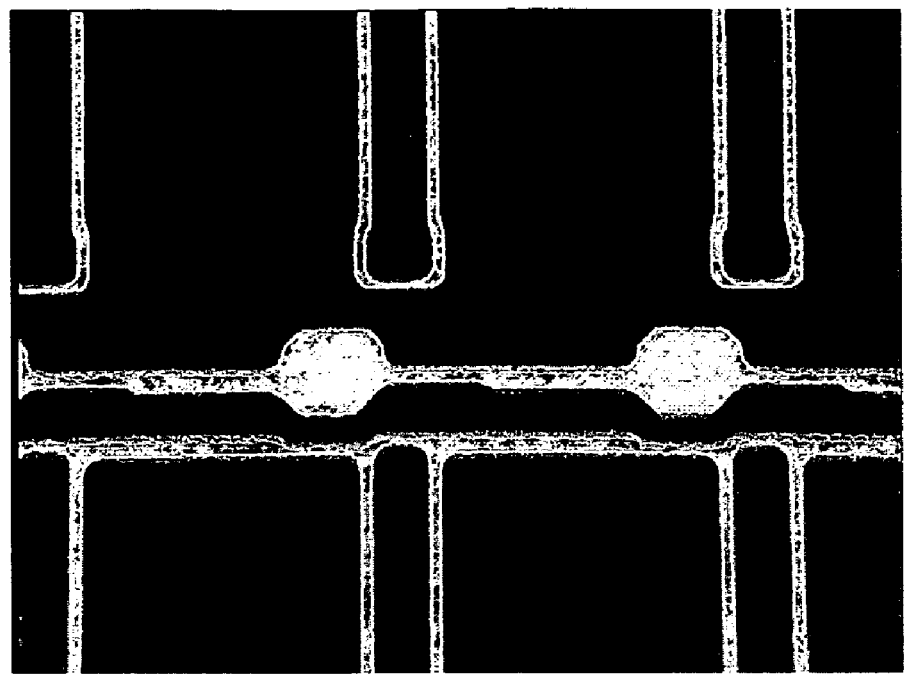
FIG. 5A is a microphotograph showing a wire structure fabricated by a method for fabricating a wire according to an embodiment of the present invention.
Figure 5B:
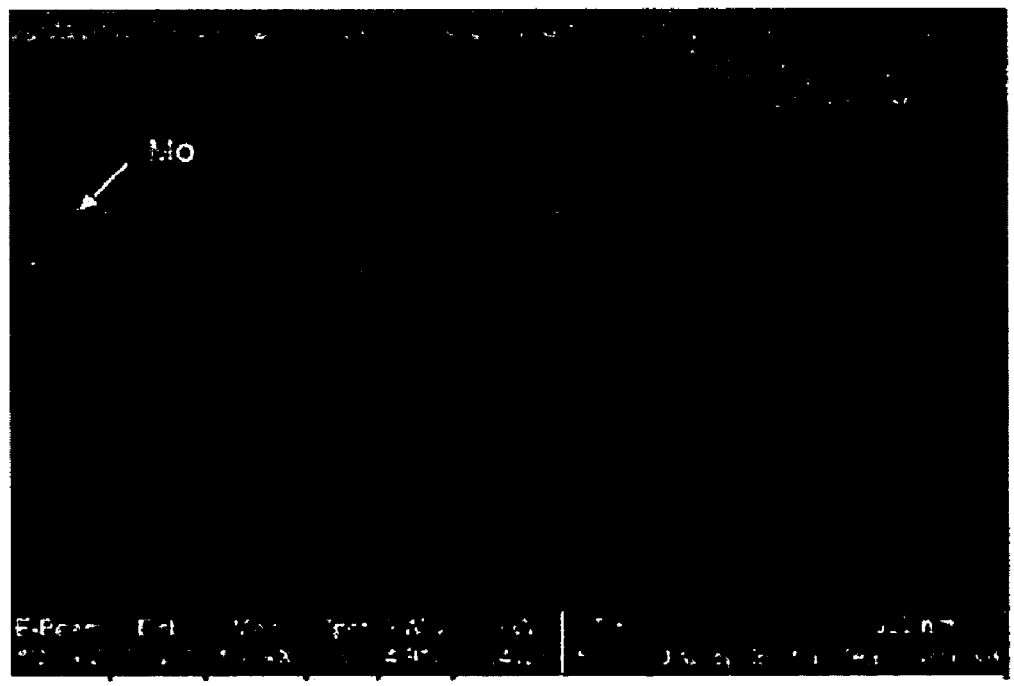
FIG. 5B is a sectional view showing a wire structure fabricated by a method for fabricating a wire according to an embodiment of the present invention.

To evaluate adhesion and a lateral profile of the wire 2, the plane and cross-section of the wire 2 are microphotographed. FIG. 5A is a microphotograph showing a wire structure fabricated by a method for fabricating a wire according to an embodiment of the present invention, and FIG. 5B is a sectional view showing a wire structure fabricated by a method for fabricating a wire according to an embodiment of the present invention. In FIGS. 5A and 5B, relatively brighter areas indicate wire regions. Here, the wire structure has a triple-layered structure including a barrier layer made of CuN, a copper conductive layer made of Cu and a capping layer made of Mo having thicknesses of 200 Å, 2000 Å and 500 Å, respectively.

Referring to FIGS. 5A and 5B, a clean wire pattern is formed without any corrosion even after a patterning processing such as wet etching and the removal of a photoresist layer. The resultant wire, including a copper conductive layer, is well adhered to a substrate. In addition, it can be seen that the lateral profile of the wire has no overhang and has a good tapered angle. Thus, the wire has a superior signal characteristic as a low-resistance wire. Moreover, the wire has superior adhesion and lateral profile and thus its reliability is high.

The above-described wire structure and the fabrication method thereof according to the present invention can be applied to a TFT substrate for an LCD or an organic EL display, a semiconductor device, a semiconductor apparatus, and any other areas necessitating precise wiring patterns. In the preferred embodiments described below, while the present invention will be described with regard to a TFT substrate, it is apparent to those skilled in the art that the invention is not limited thereto.

The term "thin film transistor substrate" used herein refers to a substrate encompassing at least one TFT but does not preclude the intervention of another structure between the TFT and the substrate or the presence of additional structure formed thereon.

Figure 6A:
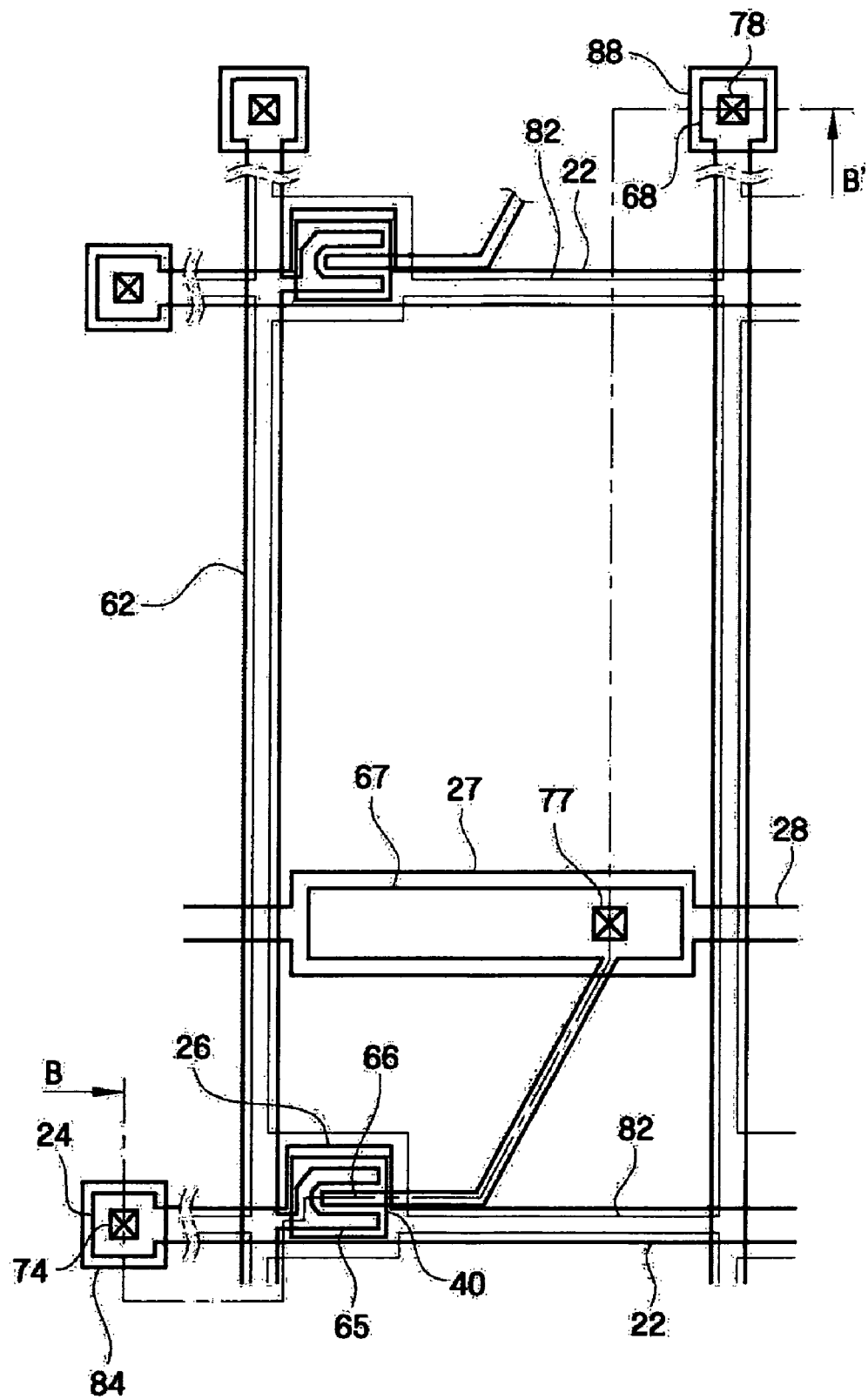
FIG. 6A is a layout illustrating a thin film transistor (TFT) substrate according to an embodiment of the present invention.

First, a thin film transistor (TFT) substrate according to an embodiment of the present invention including the wire structure stated above will be described with reference to FIGS. 6A and 6B. FIG. 6A is a layout illustrating a thin film transistor (TFT) substrate according to an embodiment of the present invention, and FIG. 6B is a sectional view taken along a line B-B' of FIG. 6A.

Figure 6B:
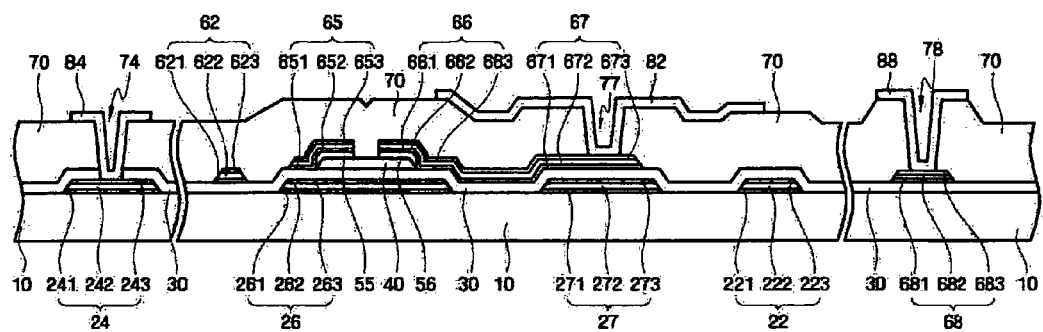
FIG. 6B is a sectional view taken along a line B-B' of FIG. 6A.

As shown in FIGS. 6A and 6B, a plurality of gate wires transmitting a gate signal is formed on an insulating substrate 10. The gate wires include a gate line 22 that extends in a transverse direction, a gate pad 24 that is connected to the end of the gate line 22 to receive a gate signal from external circuits (not shown). A gate electrode 26 of the TFT is connected to the gate line 22. A storage electrode 27 and a storage electrode line 28 are formed parallel with the gate line 22. The storage electrode line 28 extends in a transverse direction across a pixel region and is connected to the storage electrode 27 that is wider than the storage electrode line 28. The storage electrode 27 overlaps a drain electrode extension portion 67 connected with the pixel electrode 82. As will later be described, this overlapping structure forms a storage capacitor that enhances the charge storage capacity of a pixel. Various shapes and arrangement of the storage electrode line 28 and the storage electrode 27 may be used. When storage capacitance generated by overlapping of the pixel electrode 82 and the gate line 22 is sufficient, formation of the storage electrode 27 may be omitted.

As shown in FIG. 6B, the gate wires 22, 24, 26, and 27 have triple-layered structures including barrier layers 221, 241, 261, and 271 including copper nitride, conductive layers 222, 242, 262, and 272 including copper or a copper alloy, and capping layers 223, 243, 263, and 273, respectively. Although not directly shown in the drawing, the storage electrode line 28 has the same multi-layered structure as the gate wires 22, 24, 26, and 27. In the gate wires having the multi-layered structures which are described below, the storage electrode line 28 is also included and multi-layered characteristics of the gate wires 22, 24, 26, and 27 hold true for the storage electrode line 28 as well.

The wire structure according to an embodiment of the present invention can be applied to the multi-layered gate wires 22, 24, 26, and 27. Here, the barrier layers 221, 241, 261, and 271 assist adhesion of the overlying conductive layers 222, 242, 262, and 272 to the insulating substrate 10 and prevent materials forming the insulating substrate 10 and the conductive layers 222, 242, 262, and 272 from being diffused into each other.

A gate insulating layer 30 is formed of silicon nitride (SiNx) on the substrate 10 and the gate wires 22, 24, 26, 27, and 28. A semiconductor layer 40 is formed of hydrogenated amorphous silicon or polycrystalline silicon in the shape of an island on the gate insulating layer 30 on the gate electrode 26. Ohmic contact layers 55 and 56 are formed on the semiconductor layer 40 and may be made of silicide or n+ hydrogenated amorphous silicon doped with high concentration n-type impurity.

Data wires are formed on the ohmic contact layers 55 and 56 and the gate insulating layer 30. The data lines include a data line 62 substantially extending in a longitudinal direction and intersecting a gate line 22 to define pixels, a source electrode 65 connected to the data line 62 and extending over the ohmic contact layer 55, a data pad 68 connected to an end of the data line 62 and receiving a picture signal from external circuits, a drain electrode 66 spaced apart from the source electrode 65 and formed on the ohmic contact layer 56 to be opposite to the source electrode 65 in view of the gate electrode 26, and a drain electrode extension portion 67 extending from the drain electrode 66 and having a large area overlapping with the storage electrode 27.

Like the gate wires 22, 24, 26, and 27, the data wires 62, 65, 66, 67, and 68 are formed of triple-layered structures including barrier layers 621, 651, 661, 671, and 681 including copper nitride, conductive layers 622, 642, 662, 672, and 682 including copper or a copper alloy, and capping layers 623, 643, 663, 673, and 683, respectively. The wire structure according to an embodiment of the present invention is applied to the data wires 62, 65, 66, 67, and 68 formed of multi-layered structures. Here, the barrier layers 621, 651, 661, 671, and 681 complement adhesion of the conductive layers 622, 642, 662, 672, and 682 to a substrate, that is, the ohmic contact layers 55 and 56 and the gate insulating layer 30 and prevent materials forming the ohmic contact layers 55 and 56, the gate insulating layer 30 and the conductive layers 622, 642, 662, 672, and 682 from being diffused into each other.

The source electrode 65 overlaps with at least a portion of the semiconductor layer 40. The drain electrode 66 is opposed to and faces the source electrode 65 in view of the gate electrode 26 and overlaps with at least a portion of the semiconductor layer 40. The ohmic contact layers 55 and 56 exist between the underlying semiconductor layer 40 and the overlying source electrode 65 and the drain electrode 66 to reduce the contact resistance therebetween.

The drain electrode extension portion 67 overlaps with the storage electrode 27 to form a storage capacitor interposing the gate insulating layer 30 between the storage electrode 27 and the drain electrode extension portion 67. In the absence of the storage electrode 27, the drain electrode extension portion 67 may not be formed.

Here, the gate electrode 26, the semiconductor layer 40 formed thereon, the ohmic contact layers 55 and 56, the source electrode 65, and the drain electrode 66 constitute a TFT and the semiconductor layer 40 constitutes a channel portion of the TFT. In the illustrative embodiment of the present invention, a bottom gate-type TFT where the gate electrode 26 is formed under the semiconductor layer 40 including the channel portion is adopted.

A passivation layer 70 is formed on the data lines 62, 65, 66, 67, and 68, and an exposed portion of the semiconductor layer 40 therethrough. The passivation layer 70 may be preferably made of a photosensitive organic material having a good flatness characteristic, a low dielectric insulating material such as a-Si:C:O and a-Si:O:F formed by plasma enhanced chemical vapor deposition (PECVD), or an inorganic insulator such as silicon nitride. When the passivation layer 70 is made of an organic material, an insulation layer (not shown) made of silicon nitride (SiN) or silicon oxide ($SiO_2$) may further be provided under the organic layer in order to prevent an organic material of the passivation layer 70 from contacting an exposed portion of the semiconductor layer 40 between the source electrode 65 and the drain electrode 66.

Contact holes 77 and 78 are formed in the passivation layer 70 to expose the drain electrode extension portion 67 and the data pad 68, respectively. A contact hole 74 is formed in the passivation layer 70 and the gate insulating layer 30 to expose the gate pad 24. A pixel electrode 82 is formed on the passivation layer 70 in such a way to be electrically connected to the drain electrode 66 via the contact hole 77 and positioned in a pixel area. A pixel electrode 82 is physically and electrically connected to the drain electrode 66 through the contact hole 77 such that the pixel electrode 82 receives data voltages from the drain electrode 66. Electric fields are generated between the pixel electrode 82 supplied with the data voltages and a common electrode of an upper display substrate, which determine an orientation of liquid crystal molecules in the LC layer between the pixel electrode 82 and the common electrode.

Furthermore, an auxiliary gate pad 84 and an auxiliary data pad 88 are formed on the passivation layer 70 in such a way to be connected to the gate pad 24 and the data pad 68 via the contact holes 74 and 78, respectively. The pixel electrode 82 and the auxiliary gate pad 84 and the auxiliary data pad 88 are preferably made of a transparent conductor such as ITO.

The TFT substrate according to an embodiment of the present invention can be applied to liquid crystal display (LCD) or the like.

Next, a method for fabricating a TFT substrate according to an embodiment of the present invention will be described in detail with reference to FIGS. 6A and 6B and 7A through 10B. Since one skilled in the art will be some of some of the specific details of the invention As to portions to which the method for forming the wire structure according to an embodiment of the present invention can be applied, some of specific technical details are not discussed or briefly described as long as the concrete embodiments can be readily envisioned or understood by one skilled in the art. FIGS. 7A, 8A, 9A, and 10A are layouts sequentially illustrating a method for fabricating a TFT substrate according to an embodiment of the present invention, and FIGS. 7B, 8B, 9B, and 10B are sectional views taken along lines B-B' of FIGS. 7A, 8A, 9A, and 10A.

Figure 7A:
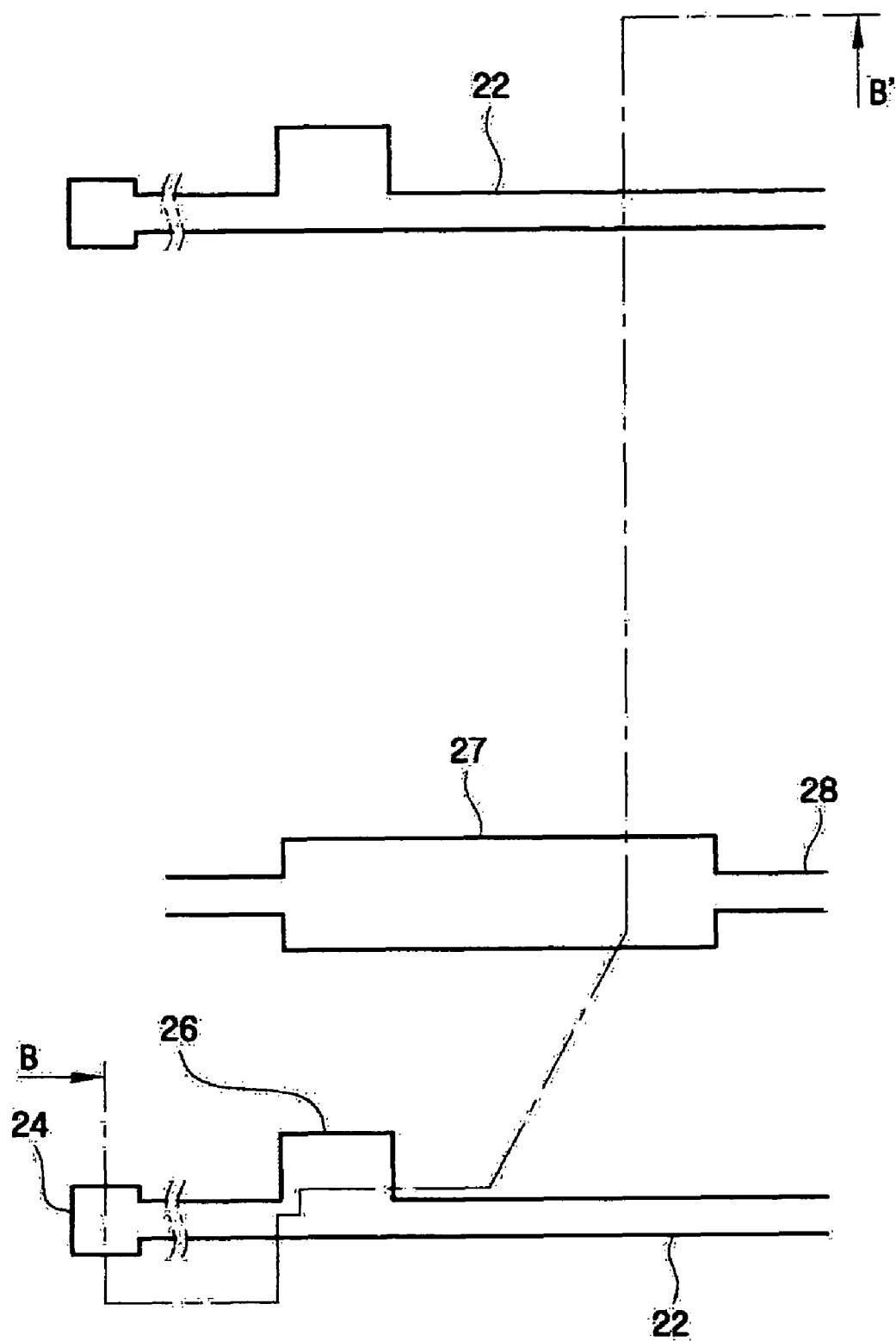
FIGS. 7A, 8A, 9A, and 10A are layouts sequentially illustrating a method for fabricating a TFT substrate according to an embodiment of the present invention.
Figure 7B:
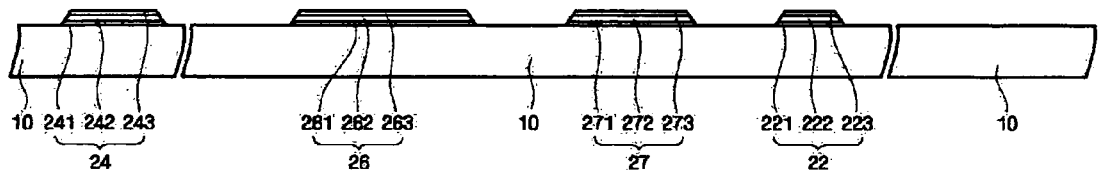
FIGS. 7B, 8B, 9B, and 10B are sectional views taken along lines B-B' of FIGS. 7A, 8A, 9A, and 10A.

First, as shown in FIGS. 7A and 7B, gate multi-layers are formed by sequentially depositing the barrier layers 221, 241, 261, and 271 including copper nitride, copper conductive layers 222, 242, 262, and 272 including copper or a copper alloy, and capping layers 223, 243, 263, and 273 on the insulating substrate 10 using sputtering. Next, a photoresist pattern defining the gate wires 22, 24, 26, 27, and 28 is formed on the gate multi-layers and the capping layers 223, 243, 263, and 273, the copper conductive layers 22, 242, 262, and 272 and the barrier layers 221, 241, 261, and 271 are sequentially or etched in a batch process using the photoresist pattern as an etching mask. The photoresist pattern is then removed. Thus, the gate wires including the gate line 22, the gate electrode 26, the gate pad 24, the storage electrode 27, and the storage electrode line 28 are formed. The gate wires 22, 24, 26, 27, and 28 are formed using a method for fabricating a wire according to an embodiment of the present invention. Thus, as described with reference to FIGS. 5A and 5B, the formed gate wires 22, 24, 26, 27, and 28 including the copper conductive layers 222, 242, 262, and 272 are well adhered to a substrate and their lateral profiles do not have overhang and have a good tapered angle even after wet etching and the removal of a photoresist layer.

Figure 8A:
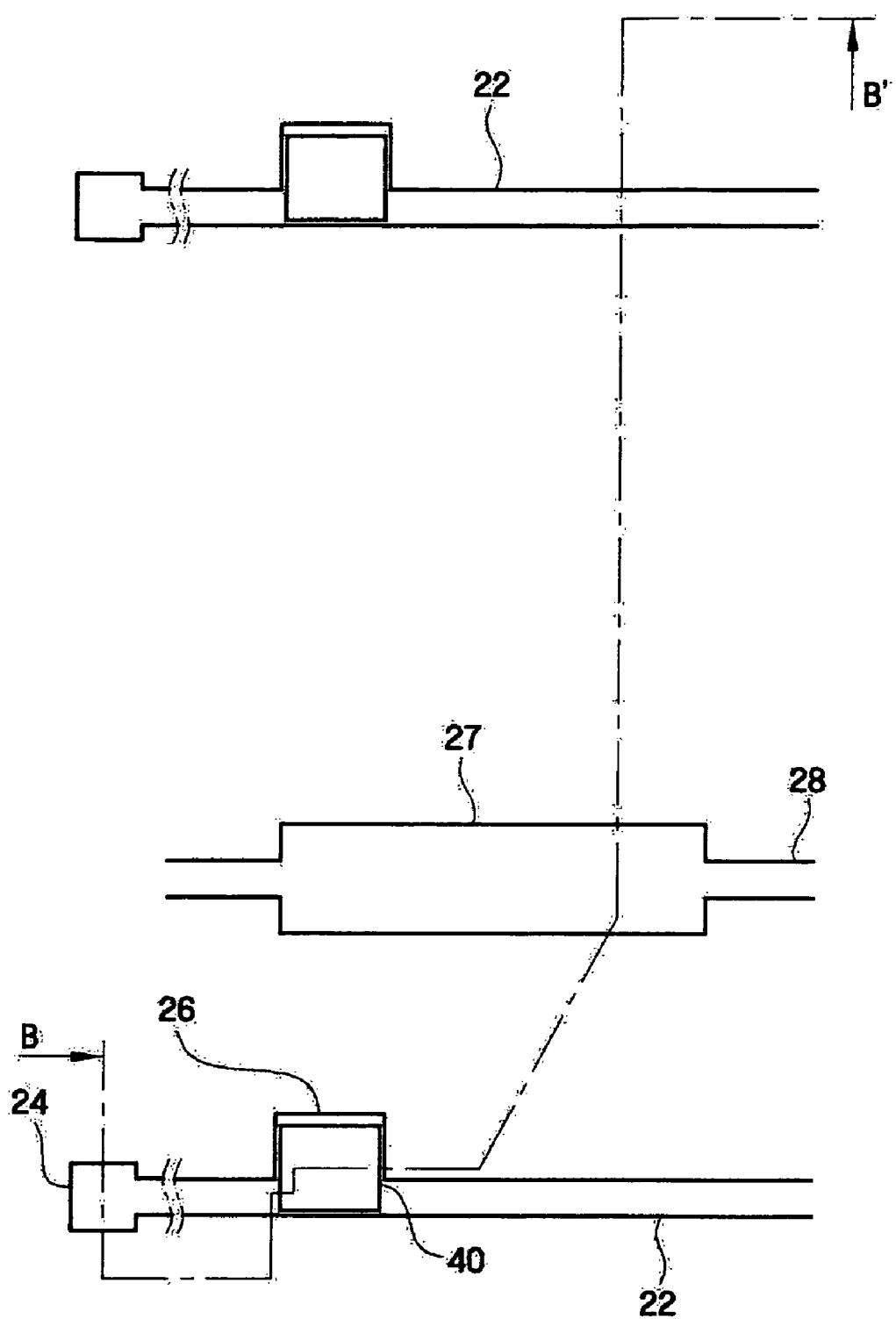
Figure 8B:
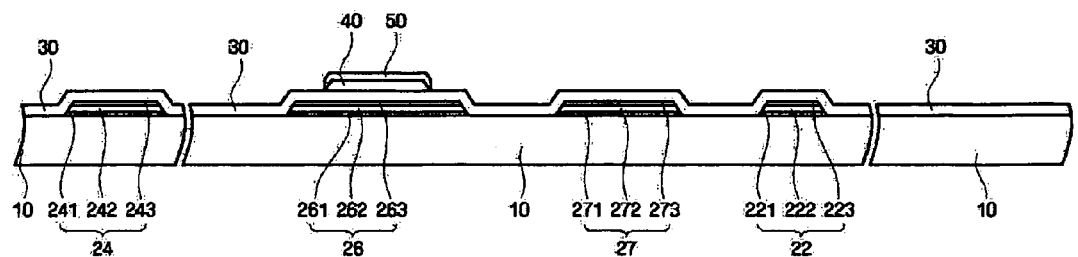

Next, as shown In FIGS. 8A and 8B, the gate insulating layer 30 made of silicon nitride, an intrinsic amorphous silicon layer, and a doped amorphous silicon layer are continuously deposited to a thickness of 1500-5000 Å, a thickness of 500-2000 Å, and a thickness of 300-600 Å, respectively, using chemical vapor deposition (CVD). Photolithography is performed on the intrinsic amorphous silicon layer and the doped amorphous silicon layer, thereby forming the island-shaped semiconductor layer 40 and a doped semiconductor layer 50 on the gate insulating layer 30 on the gate electrode 24.

Figure 9A:
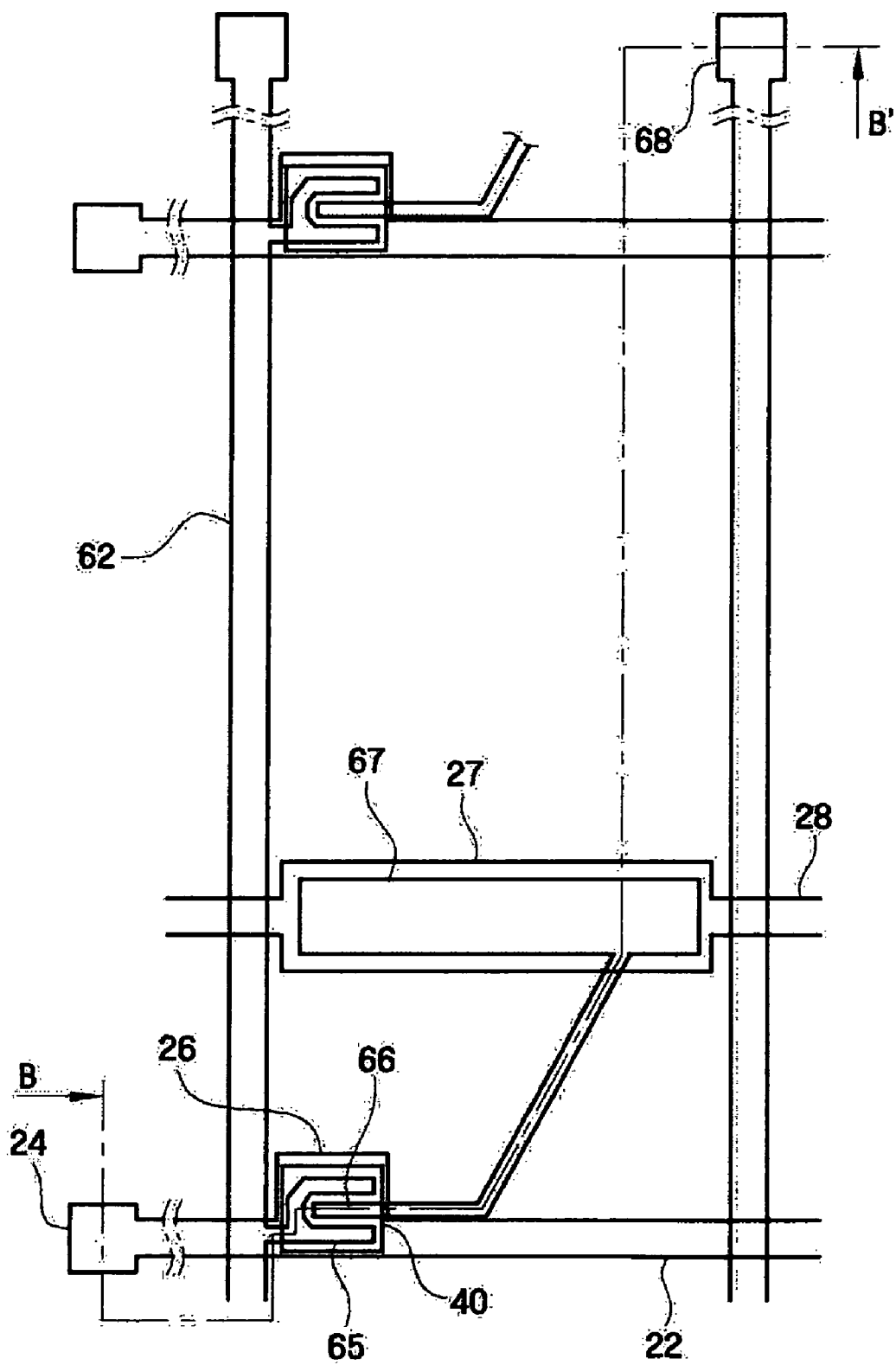
Figure 9B:
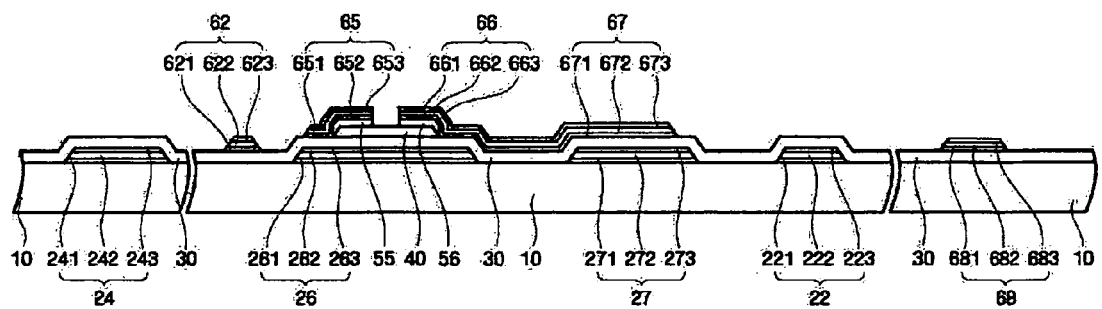

Referring to FIGS. 9A and 9B, data multi-layers are formed by sequentially depositing the barrier layers 621, 651, 661, 671, and 681 including copper nitride, the conductive layers 622, 642, 662, 672, and 682 including copper or a copper alloy, and the capping layers 623, 643, 663, 673, and 683 on the gate insulating layer 30 and the doped semiconductor layer 50 using sputtering. A photoresist pattern defining the data wires 62, 65, 66, 67, and 68 is formed on the data multi-layers and the capping layers 623, 643, 663, 673, and 683, the conductive layers 622, 642, 662, 672, and 682, and the barrier layers 621, 651, 661, 671, and 681 are sequentially or etched in a batch process using the photoresist pattern as an etching mask, thereby exposing the doped semiconductor layer 50 under a channel portion. The photoresist pattern is then removed. The data wires 62, 65, 66, 67, and 68 are formed, the data wires 62, 65, 66, 67, and 68 including the data line 62 substantially extending in a longitudinal direction and intersecting the gate line 22, the source electrode 65 connected to the data line 62 and extending over the ohmic contact layer 55, the data pad 68 connected to an end of the data line 62 and receiving a picture signal from external circuits, the drain electrode 66 spaced apart from the source electrode 65 and formed on the ohmic contact layer 56 to be opposite to the source electrode 65 in view of the gate electrode 26, and the drain electrode extension portion 67 extending from the drain electrode 66 and having a large area overlapping with the storage electrode 27. The data wires 62, 65, 66, 67, and 68 are formed by the same method as the method for forming the wire structure according to an embodiment of the present invention. Thus, as described with reference to FIGS. 5A and 5B, the formed data wires 62, 65, 66, 67, and 68 are well adhered to a substrate and their lateral profiles do not have overhang and have a good tapered angle even after wet etching.

Next, dry etching is performed on the doped semiconductor layer 50 exposed through the data wires 62, 65, 66, 67, and 68, thereby forming the ohmic contact layers 55 and 56 at both sides in view of the gate electrode 26 and exposing the semiconductor layer 40 between the ohmic contact layers 55 and 56. At this time, etching may be performed using the source electrode 65 and 66 as etching masks and the photoresist pattern may be removed after dry etching may be performed on the doped semiconductor layer 40 using the photoresist pattern defining the data wires 62, 65, 66, 67, and 68 as an etching mask. Thus, a bottom gate-type TFT is formed, including the gate electrode 26, the semiconductor layer 40 formed thereon, the ohmic contact layers 55 and 56, the source electrode 65, and the drain electrode 66 in which the gate electrode 26 is formed under the channel portion of the semiconductor layer 40.

Figure 10A:
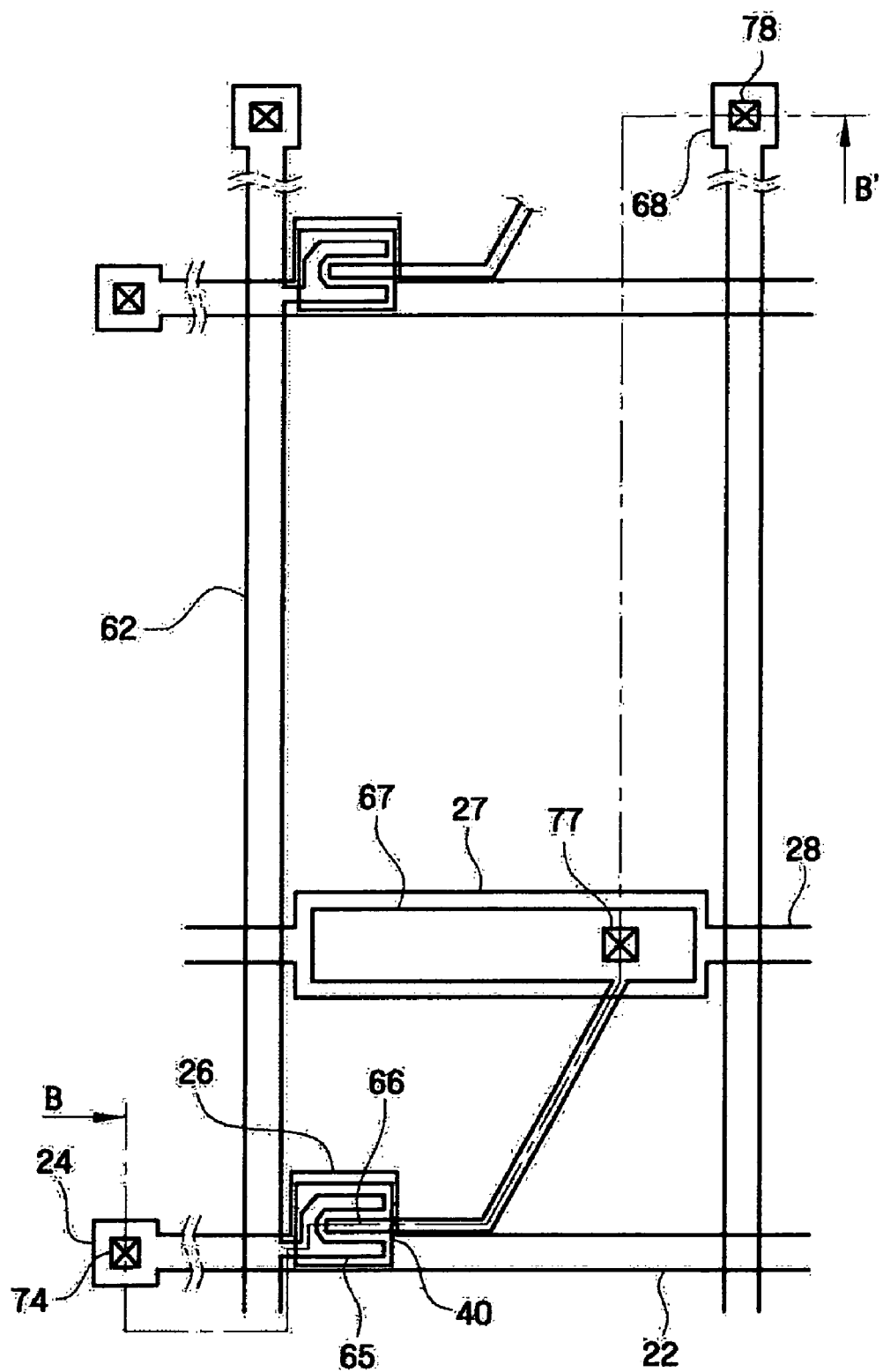
Figure 10B:
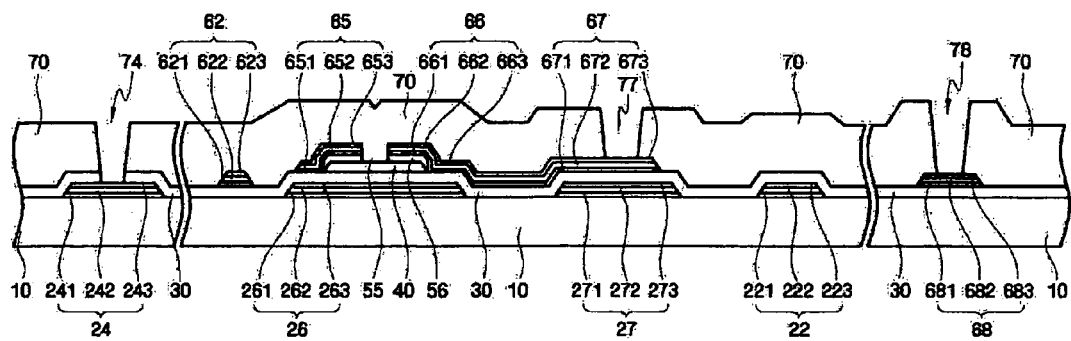

Next, as shown in FIGS. 10A and 10B, the passivation layer 70 is formed of a single layer or multi-layers made of an organic material having superior flatness properties and photosensitivity, an insulating material having a low dielectric constant formed by plasma enhanced chemical vapor deposition (PECVD), such as a-Si:C:O or a-Si:O:F, or an inorganic material such as SiNx.

Next, the gate insulating layer 30 and the passivation layer 70 are patterned by photolithography, thereby forming the contact holes 74, 77, and 78 exposing the gate pad 24, the drain electrode extension portion 67, and the data pad 68. When the passivation layer 70 is made of the organic material having photosensitivity, the contact holes 74, 77, and 78 can be formed just by photolithography, preferably on the etching condition with the same etching selectivity to the gate insulating layer 30 and the passivation layer 70.

Next, as shown in FIGS. 5A and 5B, an indium tin oxide (ITO) layer is deposited and photolithography is performed on the ITO layer, thereby forming the pixel electrode 82 connected to the drain electrode 66 through the contact hole 77 and the auxiliary gate pad 84 and the auxiliary data pad 88 connected to the gate pad 24 and the data pad 68 through the contact holes 74 and 78.

Figure 11A:
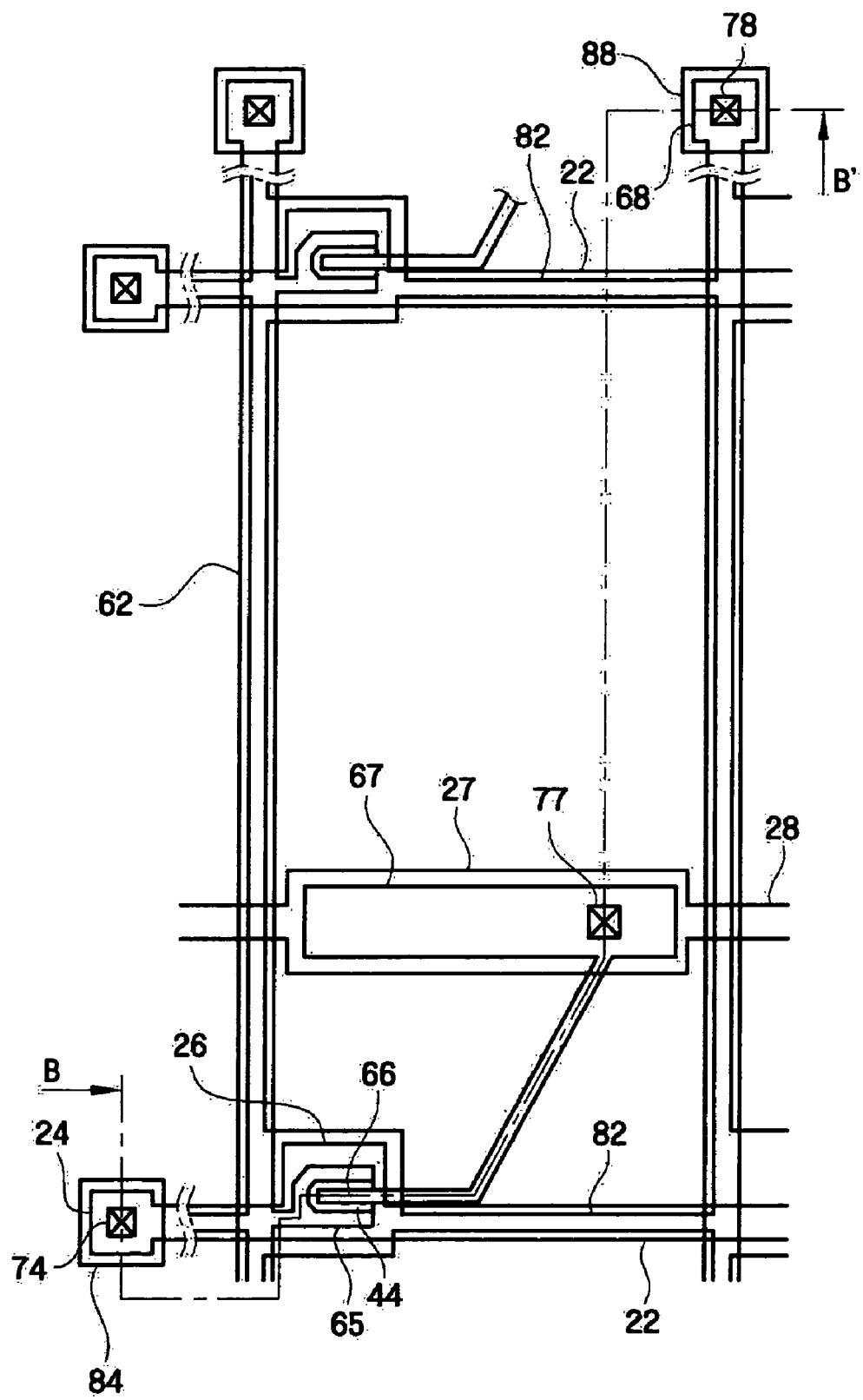
FIG. 11A is a layout illustrating another example of a TFT substrate according to an embodiment of the present invention.

Although the semiconductor layer is formed in the shape of an island and the TFT substrate having data wires and different patterns and a method for fabricating the TFT substrate are described in the illustrative embodiment of the present invention, the present invention can also be applied to a TFT substrate having a semiconductor layer and wires whose patterns are the same and a method for fabricating the TFT substrate thereof, which will be described with reference to FIGS. 11A and 11B. FIG. 11A is a layout illustrating another example of a TFT substrate according to an embodiment of the present invention, and FIG. 11B is a sectional view taken along a line B-B' of FIG. 11A.

Figure 11B:
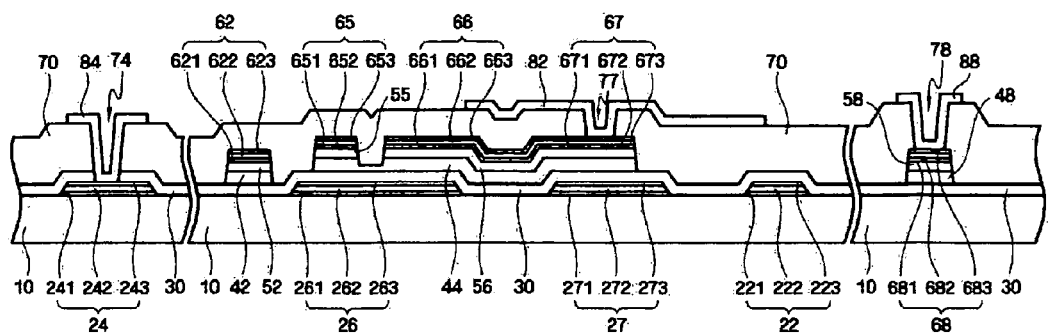
FIG. 11B is a sectional view taken along a line B-B' of FIG. 11A.

As shown in FIGS. 11A and 11B, a modified example of a TFT substrate has a similar structure as in FIGS. 6A and 6B except that semiconductor layers 42, 44, and 48 and ohmic contact layers 52, 55, 56, and 68 are formed in a linear shape having the same pattern as the data wires 62, 65, 66, 67, and 68. However, the ohmic contact layers 52, 55, 56, and 68 substantially have the same patterns as the data wires 62, 65, 66, 67, and 68 but are different in that the semiconductor layer 44 is not disconnected at the channel portion. Unlike in the fabrication method of the TFT substrate according to an embodiment of the present invention in which different masks are used to form a semiconductor layer and data wires, in the fabrication method of the TFT substrate according to another embodiment of the present invention, data wires, ohmic contact layers, and data lines are patterned using a single mask including a slit or semi-permeable membrane. Since the other processes are substantially the same as those of the fabrication method of the TFT substrate according to an embodiment of the present invention and can be readily practiced by one skilled in the art, a detailed description will not be given.

Figure 12A:
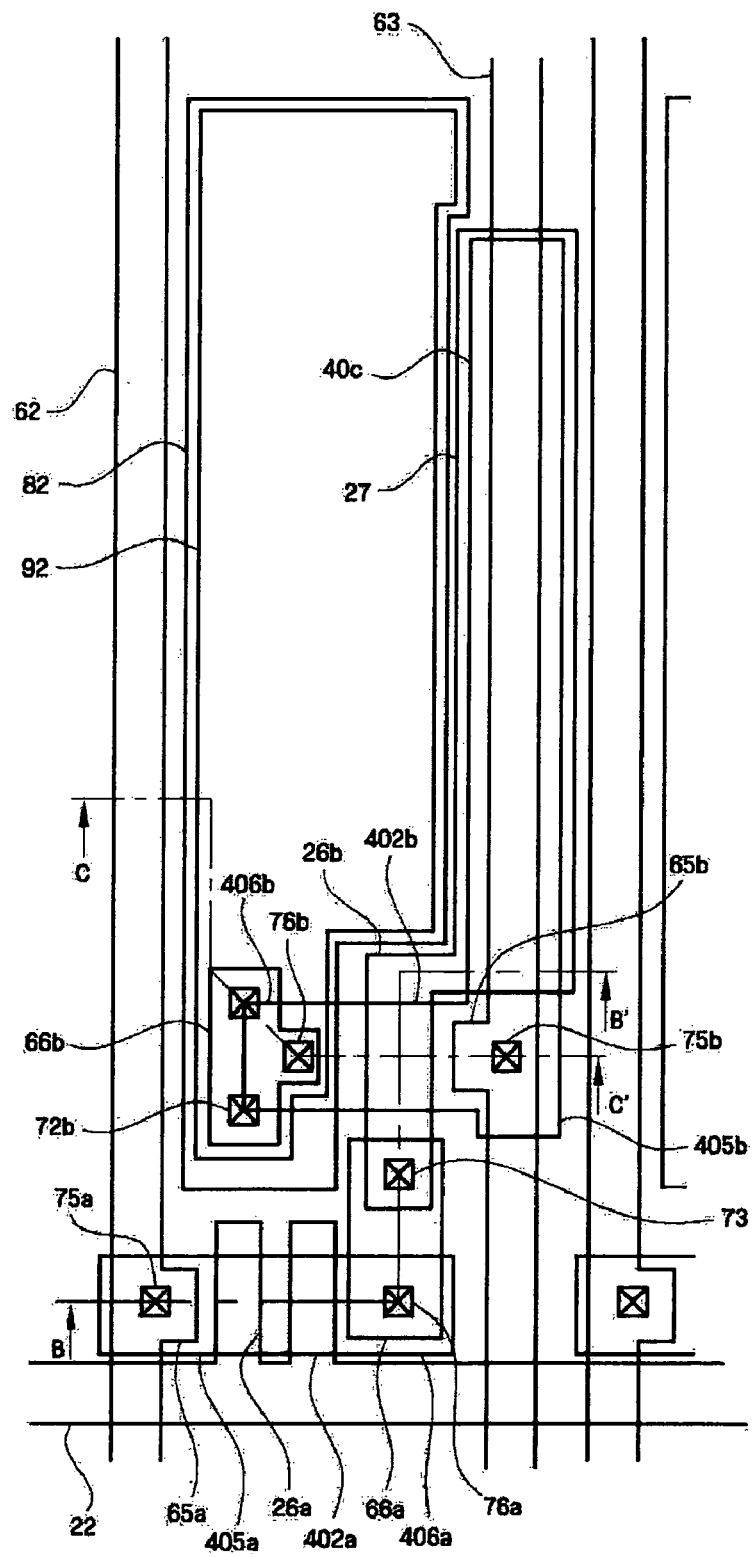
FIG. 12A is a layout illustrating a TFT substrate according to another embodiment of the present invention.
Figure 12B:
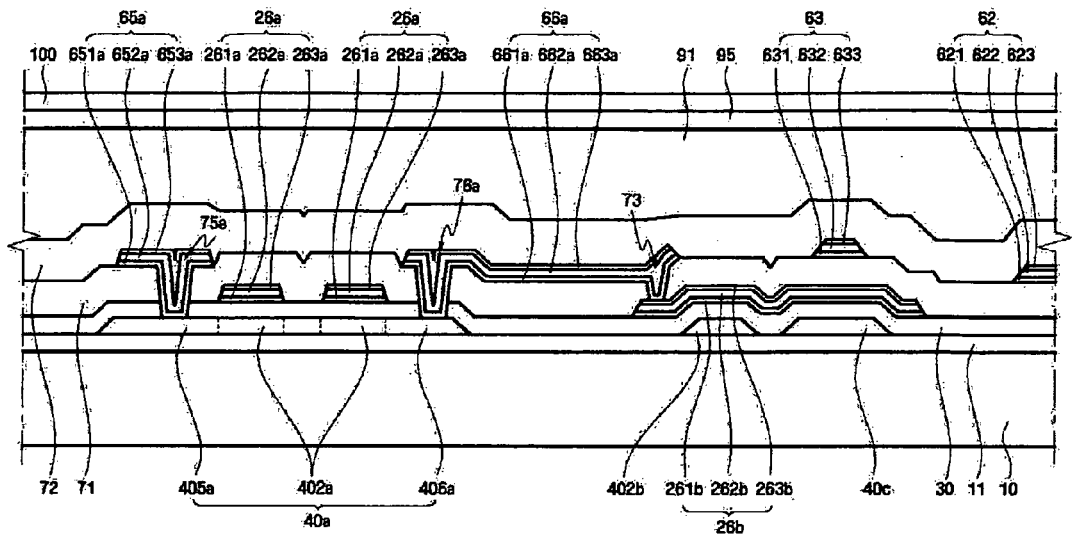
FIGS. 12B and 12C are sectional views taken along lines B-B' and C-C' of FIG. 12A.
Figure 12C:
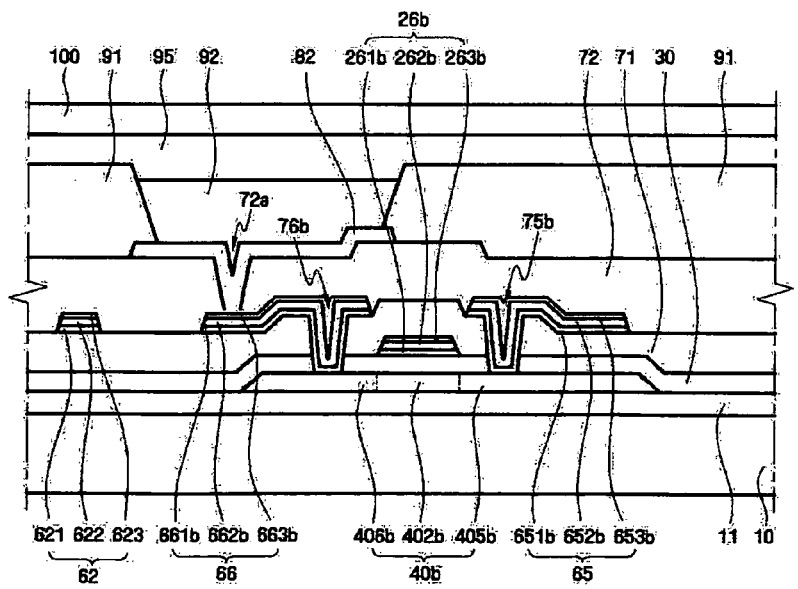

Next, a method for fabricating a TFT substrate according to another embodiment of the present invention will be described with reference to FIGS. 12A through 12C. The TFT substrate according to another embodiment of the present invention is used for organic EL display devices and includes the wire structure according to an embodiment of the present invention. As to portions to which the method for forming the wire structure according to an embodiment of the present invention can be applied, some of specific technical details are not discussed or briefly described as long as the concrete embodiments can be readily envisioned or understood by one skilled in the art. FIG. 12A is a layout illustrating a TFT substrate according to another embodiment of the present invention, and FIGS. 12B and 12C are sectional views taken along lines B-B' and C-C' of FIG. 12A.

A blocking layer 11 made of silicon oxide or silicon nitride is formed on the insulating substrate 10 and a first semiconductor layer 40a and a second semiconductor layer 40b made of polycrystalline silicon are formed on the blocking layer 11. A capacitor semiconductor layer 40c made of polycrystalline silicon is connected to the second semiconductor layer 40b. The first semiconductor layer 40a includes first TFT portions 405a, 406a, and 402a and the second semiconductor layer 40b includes second TFT portions 405b, 406b, and 402b. The first TFT portion 405a of the first TFT portions 405a, 406a, and 402a, which is to be referred to as a first source region, and the region 406a, which is to be referred to as a first drain region, are doped with n-type impurities, and the second TFT portion 405b of the second semiconductor layer 40b, which is to be referred to as a second source region, and the region 406b, which is to be referred to as a second drain region, are doped with p-type impurities. According to driving conditions, the first source and drain regions 405a and 406a may be doped with p-type impurities and the second source and drain regions 405b and 406b may be doped with n-type impurities.

A gate insulating layer 30 made of silicon oxide or silicon nitride is formed on the semiconductor layers 40a, 40b, and 40c. Gate wires are formed on the gate insulating layer 30, including a gate line 22 extending in a transverse direction, a first gate electrode 26a connected to the gate line 22 in the form of a protrusion and overlapping with the channel portion 402a of a first TFT, a second gate electrode 26b spaced apart from the gate line 22 and overlapping with the channel portion 402b of a second TFT, and a storage electrode 27 connected to the second gate electrode 26b and overlapping with the capacitor semiconductor layer 40c.

The gate wires 22, 26a, 26b, and 27 have triple-layered structures including barrier layers 261a, 261b, and 271 including copper nitride, copper conductive layers 262a, 262b, and 272 including copper or a copper alloy, and capping layers 263a, 263b, and 273. Although not directly shown in the drawing, the gate line 22 has the same multi-layered structure as the gate wires 26a, 26b, and 27. In the gate wires having the multi-layered structures which are described below, the gate line 22 is also included and multi-layered characteristics of the gate wires 26a, 26b, and 27 hold true for the gate line 22 as well.

The wire structure according to an embodiment of the present invention can be applied to the multi-layered gate wires 22, 26a, 26b, and 27. Here, the barrier layers 261a, 261b, and 271 assist adhesion of the overlying conductive layers 262a, 262b, and 272 to the gate insulation substrate 30 and prevent materials forming the gate insulation substrate 30 and the copper conductive layers 262a, 262b, and 272 from being diffused into each other.

A first interlayer insulating layer 71 is formed on the gate insulating layer 30 where the gate wires 22, 26a, 26b, and 27 are formed.

Data wires are formed on the first interlayer insulating layer 71. The data wires include a data line 62 extending in a longitudinal direction, intersecting the gate line 22, and defining pixels, a driving voltage line 63 supplying a driving voltage, a first source electrode 65a connected to the first source region 405a through a contact hole 75a as a branch of the data line 62, a first drain electrode 66a spaced apart from the first source electrode 65a and connected to the first drain region 406a, a second source electrode 65b connected to the second source region 406a through a contact hole 75b as a branch of the driving voltage line 63, and a second rain electrode 66b spaced apart from the second source electrode 65b and connected to the second drain region 406b. The first drain electrode 66a contacts the first drain region 406a and the second gate electrode 26b through contact holes 76a and 73 passing through the first interlayer insulating layer 71 and the gate insulating layer 30 and electrically connects them. The second drain electrode 66b is electrically connected with the second drain region 406b through the contact hole 76b passing through the first interlayer insulating layer 71 and the gate insulating layer 30.

Like the gate wires 22, 26a, 26b, and 27, the data wires 62, 63, 65a, 65b, 66a, and 66b have triple-layered structures including barrier layers 621, 632, 652a, 652b, 662a and 662b including copper nitride, the copper conductive layers 621, 632, 652a, 652b, 662a and 662b including copper or a copper alloy, and the capping layers 623, 643, 663, 673, and 683, respectively.

The wire structure according to an embodiment of the present invention is applied to the multi-layered data wires 62, 63, 65a, 65b, 66a, and 66b. Here, the barrier layers 621, 631, 651a, 651b, 661a and 661b complement adhesion of the copper conductive layers 621, 632, 652a, 652b, 662a and 662b to a substrate, that is, semiconductor layers 405a, 405b, 406a and 406b and the first interlayer insulating layer 71 and prevent materials forming the semiconductor layers 405a, 405b, 406a and 406b, the first interlayer insulating layer 71 and the copper conductive layers 621, 632, 652a, 652b, 662a and 662b from being diffused into each other.

Here, the semiconductor layers 40a and 40b, the first and second gate electrodes 26a and 26b, the first and second source electrodes 65a and 65b, and the first and second drain electrodes 66a and 66b constitute first and second TFT transistors, respectively. The first TFT is a switching TFT and the second TFT is a driving TFT. In the illustrative embodiment, a top gate-type TFT is formed, including the gate electrodes 26a and 26b are formed on the semiconductor layers 40a and 40b having the channel portions 402a and 402b.

A second interlayer insulating layer 72 made of silicon nitride, silicon oxide, or an organic insulating material is formed on the data wires 62, 63, 65a, 65b, 66a, and 66b and includes a contact hole 72b exposing the drain electrode 66b.

A pixel electrode 82 connected to the second drain electrode 66b through the contact hole 72b is formed on the second interlayer insulating layer 72. The pixel electrode 82 is preferably made of a high reflectivity material such as Al (or Al alloy) or Ag (or Ag alloy). When necessary, the pixel electrode 82 may be made of a transparent conductive material such as ITO or IZO. A material forming the pixel electrode 82 can be appropriately selected according to whether the display device is of a bottom emission type in which a picture is displayed downward the TFT substrate or a top emission type in which a picture is displayed upward the TFT substrate.

A partition wall 91 made of an organic insulating material is formed on the second interlayer insulating layer 72 to separate organic light emitting cells. The partition wall 91 is formed by exposing and developing a photosensitive agent including a black pigment to serve as a blocking layer and simplify its formation process. An organic light emitting layer 92 is formed in a region on the pixel electrode 82 surrounded by the partition wall 91. The organic light emitting layer 92 is made of organic layers that emit one of red, green, and blue, and the red, green, and blue organic layers of the organic light emitting layer 92 are sequentially arranged repetitively.

A buffer layer 95 is formed on the organic light emitting layer 92 and the partition wall 91. The buffer layer 95 may not be formed if necessary.

A common electrode 100 is formed on the buffer layer 95. The common electrode 100 is made of a transparent conductive material such as ITO or IZO. When the pixel electrode 82 may be made of a transparent conductive material such as ITO or IZO, the common electrode 100 may be made of a high reflectivity material such as Al (or Al alloy) or Ag (or Ag alloy).

The TFT substrate according to another embodiment of the present invention can be applied to an organic EL display device.

Next, a method for fabricating a TFT substrate according to another embodiment of the present invention will be described in detail with reference to FIGS. 12A through 12C and FIGS. 13A through 18C. As to portions to which the method for forming the wire structure according to an embodiment of the present invention can be applied, some of specific technical details are not discussed or briefly described as long as the concrete embodiments can be readily envisioned or understood by one skilled in the art. FIGS. 13A, 14A, 15A, 16A, 17A, and 18A are layouts sequentially illustrating a method for fabricating a TFT substrate according to another embodiment of the present invention, and FIGS. 13B, 14B, 15B, 16B, 17B, and 18B are sectional views taken along lines B-B' of FIGS. 13A, 14A, 15A, 16A, 17A, and 18A illustrating processing steps, and FIGS. 13C, 14C, 15C, 16C, 17C, and 18C are sectional views taken along lines C-C' of FIGS. 13A, 14A, 15A, 16A, 17A, and 18A illustrating processing steps.

Figure 13A:
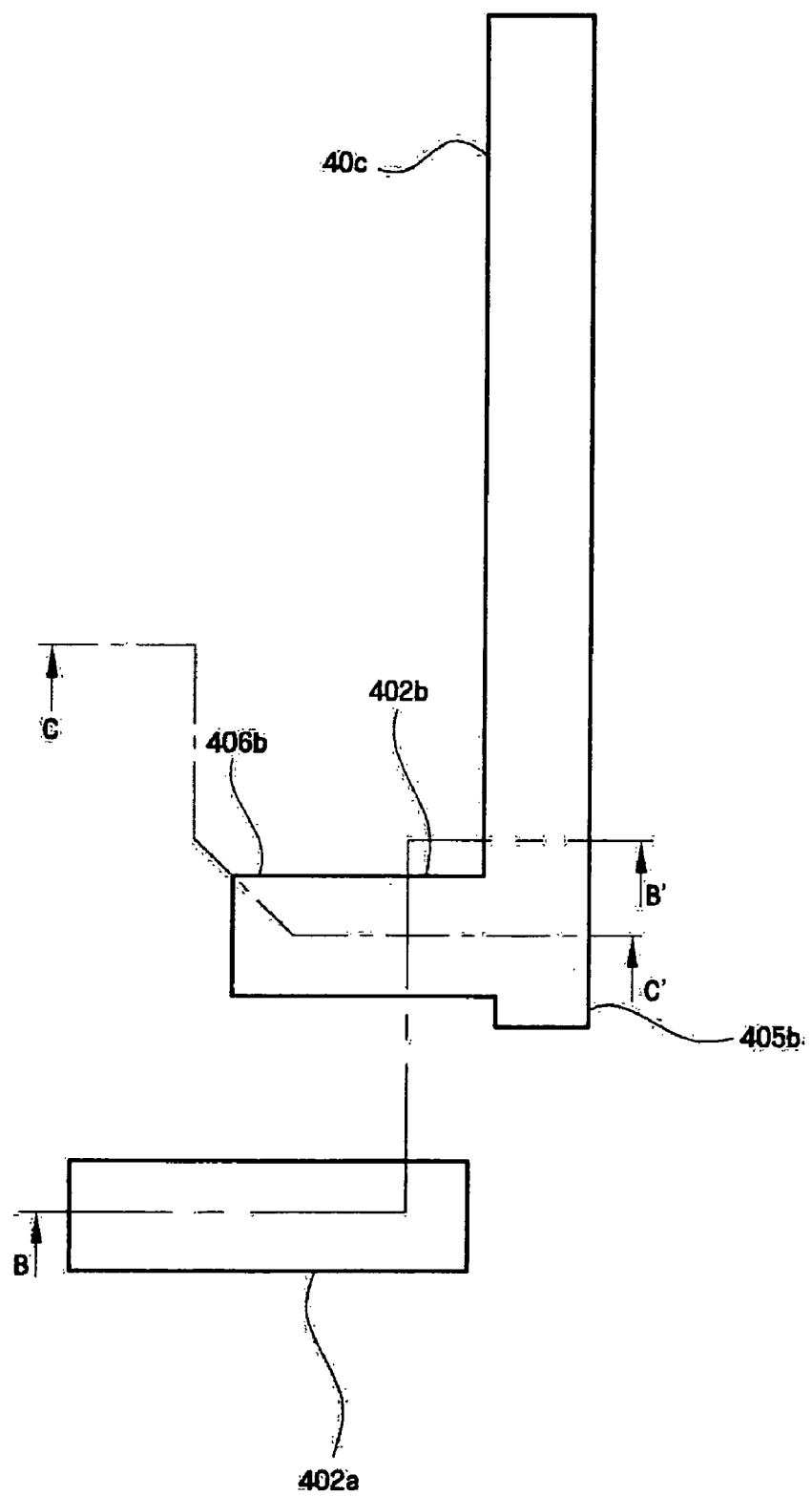
FIGS. 13A, 14A, 15A, 16A, 17A, and 18A are layouts sequentially illustrating a method for fabricating a TFT substrate according to another embodiment of the present invention.
Figure 13B:
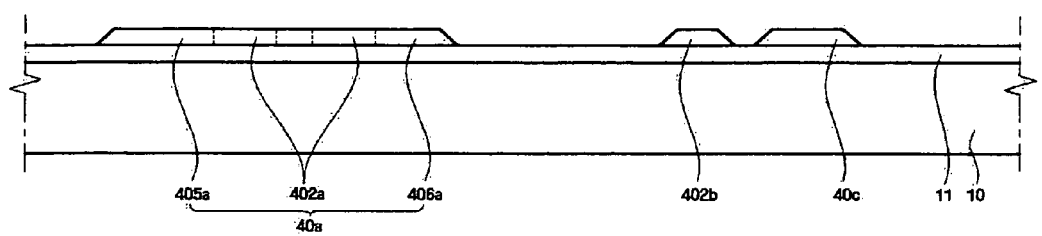
FIGS. 13B, 14B, 15B, 16B, 17B, and 18B are sectional views taken along lines B-B' of FIGS. 13A, 14A, 15A, 16A, 17A, and 18A illustrating processing steps.
Figure 13C:
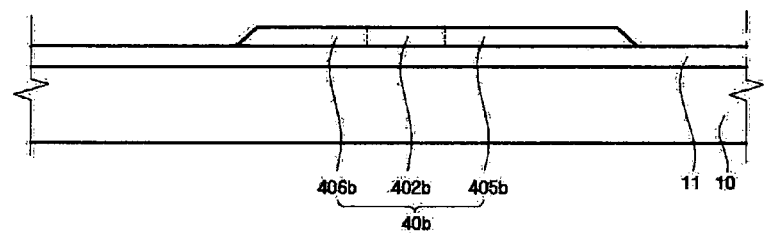
FIGS. 13C, 14C, 15C, 16C, 17C, and 18C are sectional views taken along lines C-C' of FIGS. 13A, 14A, 15A, 16A, 17A, and 18A illustrating processing steps.

Referring to FIGS. 13A through 13C, the blocking layer 11 is formed by depositing silicon oxide on the substrate 10 and amorphous silicon is deposited on the blocking layer 11 through low pressure chemical vapor deposition (LPCVD) or plasma enhanced chemical vapor deposition (PECVD) and is then patterned. Next, laser is irradiated to or heat is applied to amorphous silicon to crystallize amorphous silicon into polycrystalline silicon. Next, the semiconductor layers 40a, 40b, and 40c made of polycrystalline silicon are formed.

Figure 14A:
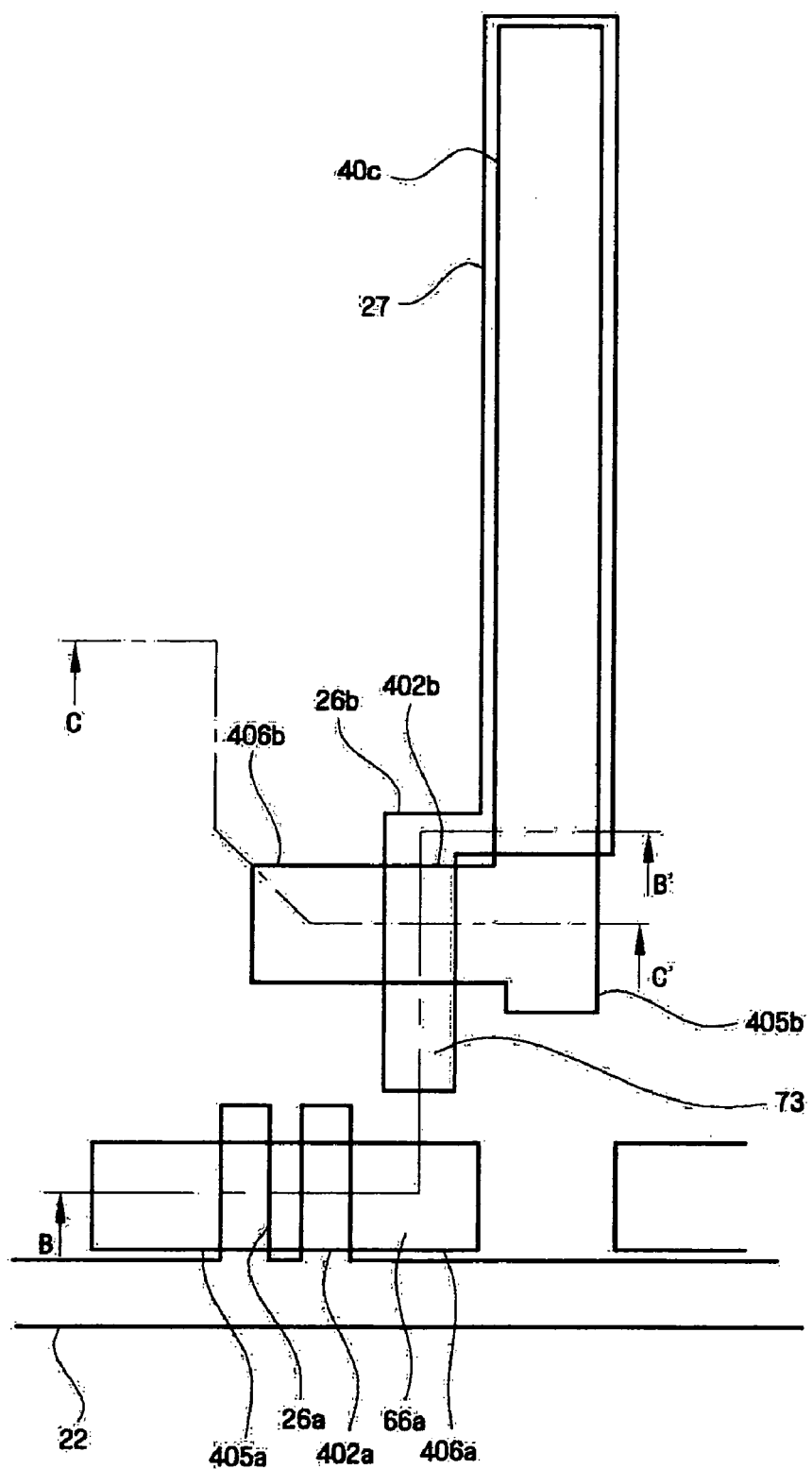
Figure 14B:
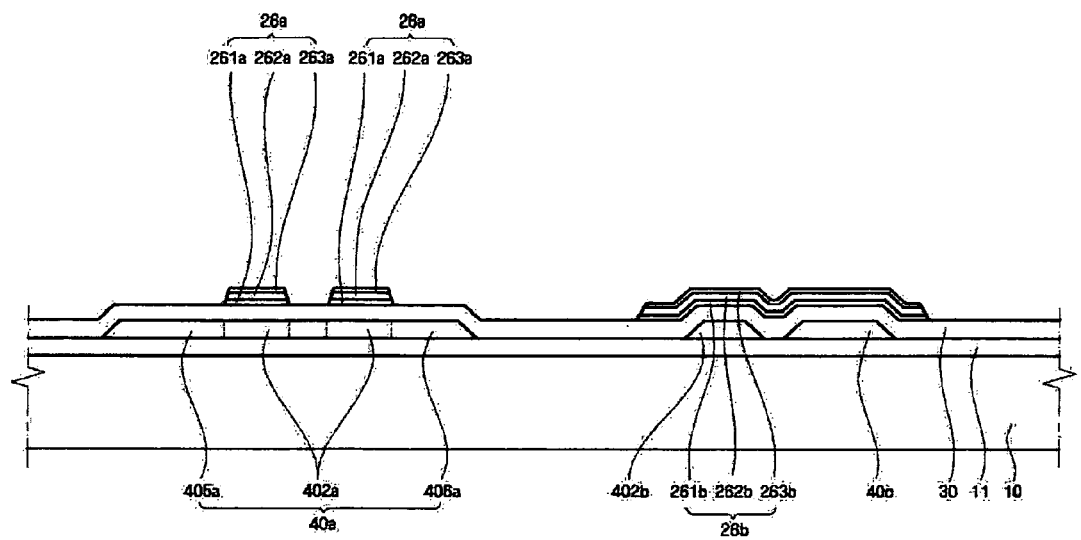
Figure 14C:
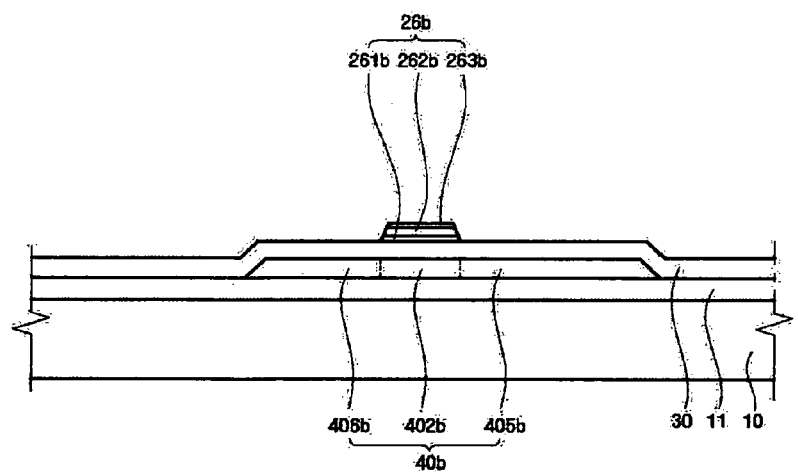

Referring to FIGS. 14A through 14C, the gate insulating layer 30 is formed on the blocking layer 11 where the semiconductor layers 40a, 40b, and 40c are formed by depositing silicon nitride using CVD.

Gate multi-layers are formed by sequentially depositing barrier layers 261a, 261b, and 271 including copper nitride, copper conductive layers 262a, 262b, and 272 including copper or a copper alloy, and capping layers 263a, 263b, and 273 on the gate insulating layer 30 using sputtering.

Next, a first photoresist pattern defining the first gate electrode 26a and the gate line 22 is formed on the gate multi-layers. A region where a second gate electrode 26b and a storage electrode 27 are to be formed is covered and protected, including a channel portion 402a of the second TFT. Next, the capping layer 263a, the copper conductive layer 262a, and the barrier layer 261a are sequentially etched or etched in a batch process using the first photoresist pattern as an etching mask.

The channel portion 402a under the first gate electrode 26a is defined by injecting n-type impurity ions in the semiconductor layer 40a of the first TFT portions and the first source region 405a and the first drain region 406a are formed. Next, the first photoresist pattern is removed. Thus, the gate line 22, the first gate electrode 26a, and the semiconductor layer 40a including the channel portion 402a, the first source region 405a, and the first drain region 406a, are formed.

Next, a second photoresist pattern defining the second gate electrode 26b and the storage electrode 27 is formed. A region where the first gate electrode 26a and the gate line 22 are formed is covered and protected, including the channel portion 402a of the first TFT. Next, the capping layers 263b and 273, the copper conductive layers 262b and 272, and the barrier layers 261b and 271 are sequentially etched or etched in a batch process using the second photoresist pattern as an etching mask.

The channel portion 402b under the second gate electrode 26b is defined by injecting p-type impurities to the semiconductor layer 40b of the second TFT portions, and the second source region 405b and the second drain region 406b are formed. Next, the second photoresist pattern is removed. Thus, the second gate electrode 26b, the storage electrode 27, and the semiconductor layer 40b including the channel portion 402b, the second source region 405b, and the second drain region 406b, are formed.

The wire structure according to an embodiment of the present invention can be applied to the gate wires 22, 26a, 26b, and 27. Therefore, the formed gate wires 22, 26a, 26b, and 27 including the copper conductive layers 262a, 262b and 272, as shown in FIGS. 5A and 5B, are well adhered to a substrate even after a patterning processing such as wet etching and the removal of a photoresist layer. In addition, the lateral profile of the wire structure has no overhang and has a good tapered angle.

Figure 15A:
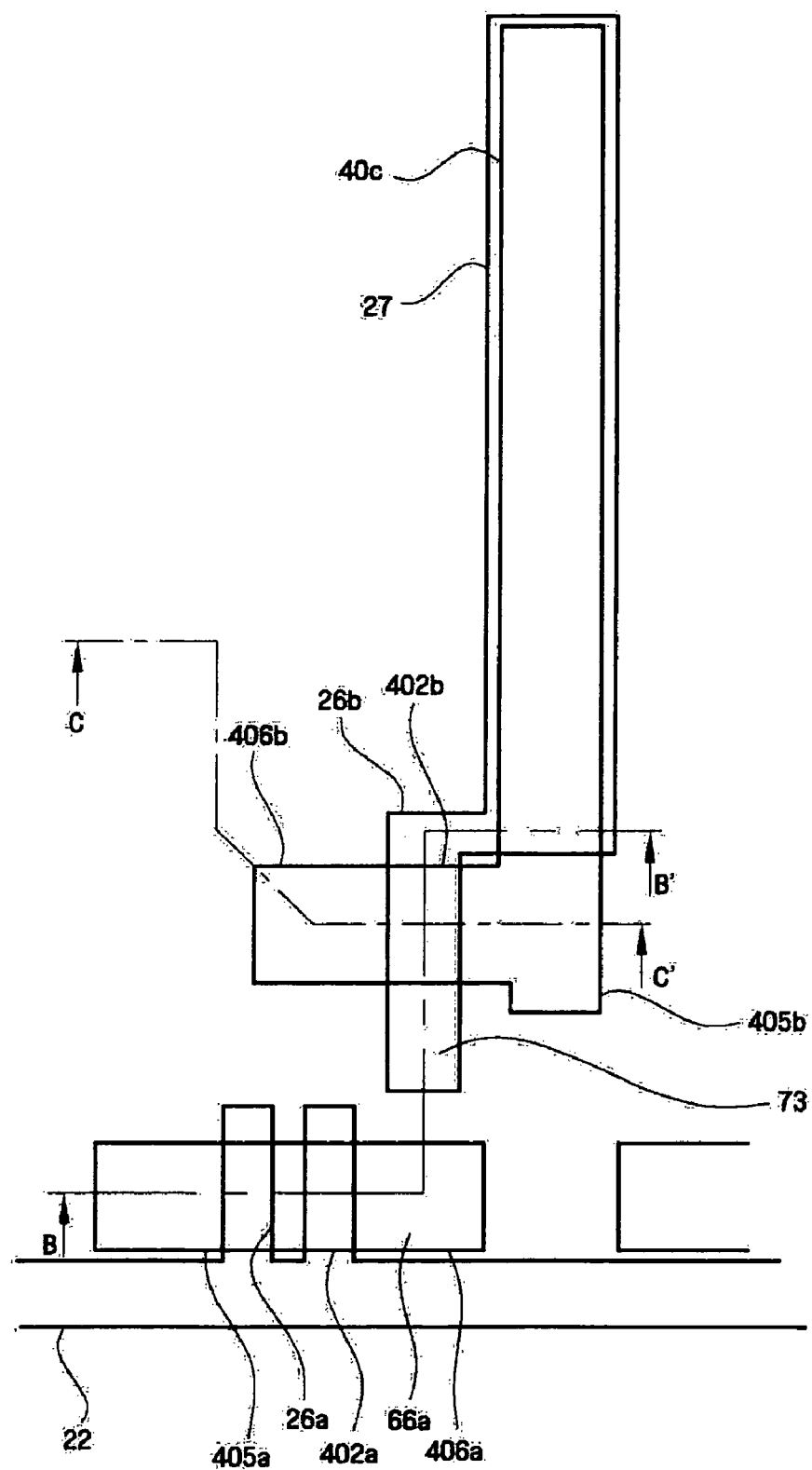
Figure 15B:
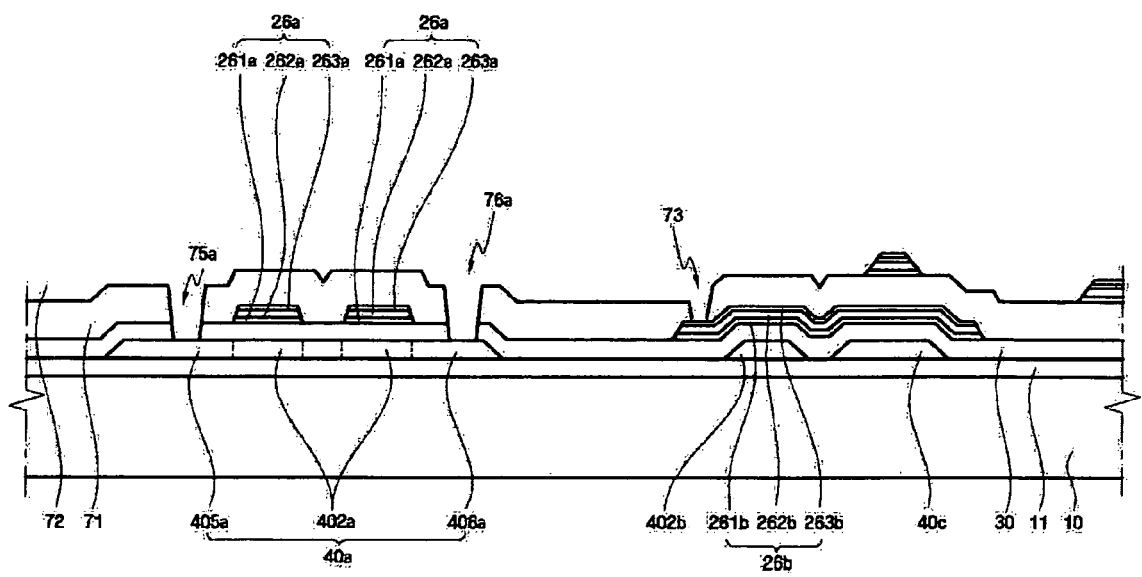
Figure 15C:
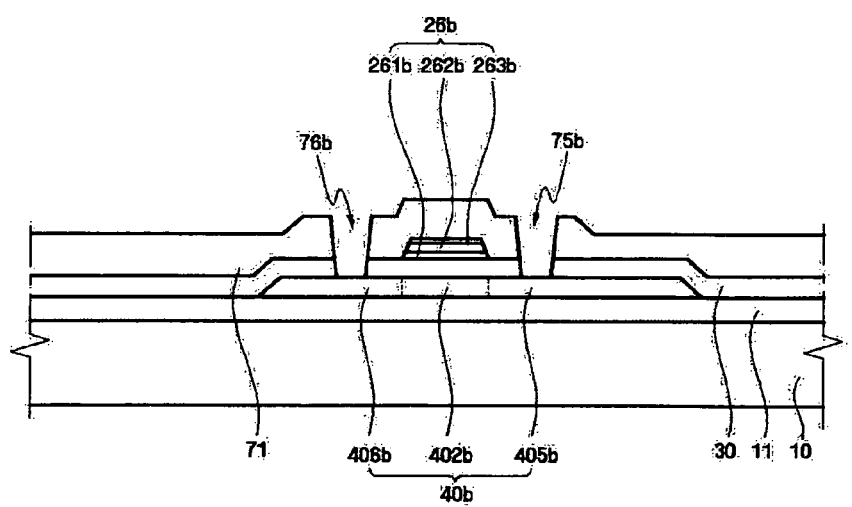

Referring to FIGS. 15A through 15C, the first interlayer insulating layer 71 is deposited on the gate insulating layer 30 where the gate wires 22, 26a, 26b, and 27 are formed and photolithography is performed on the first interlayer insulating layer 71 and the gate insulating layer 30, thereby forming contact holes 75a, 76a, 75b, and 76b exposing the first source region 405a, the first drain region 406a, the second source region 405b, and the second drain region 406b and a contact hole 73 exposing a portion of the second gate electrode 26b.

Figure 16A:
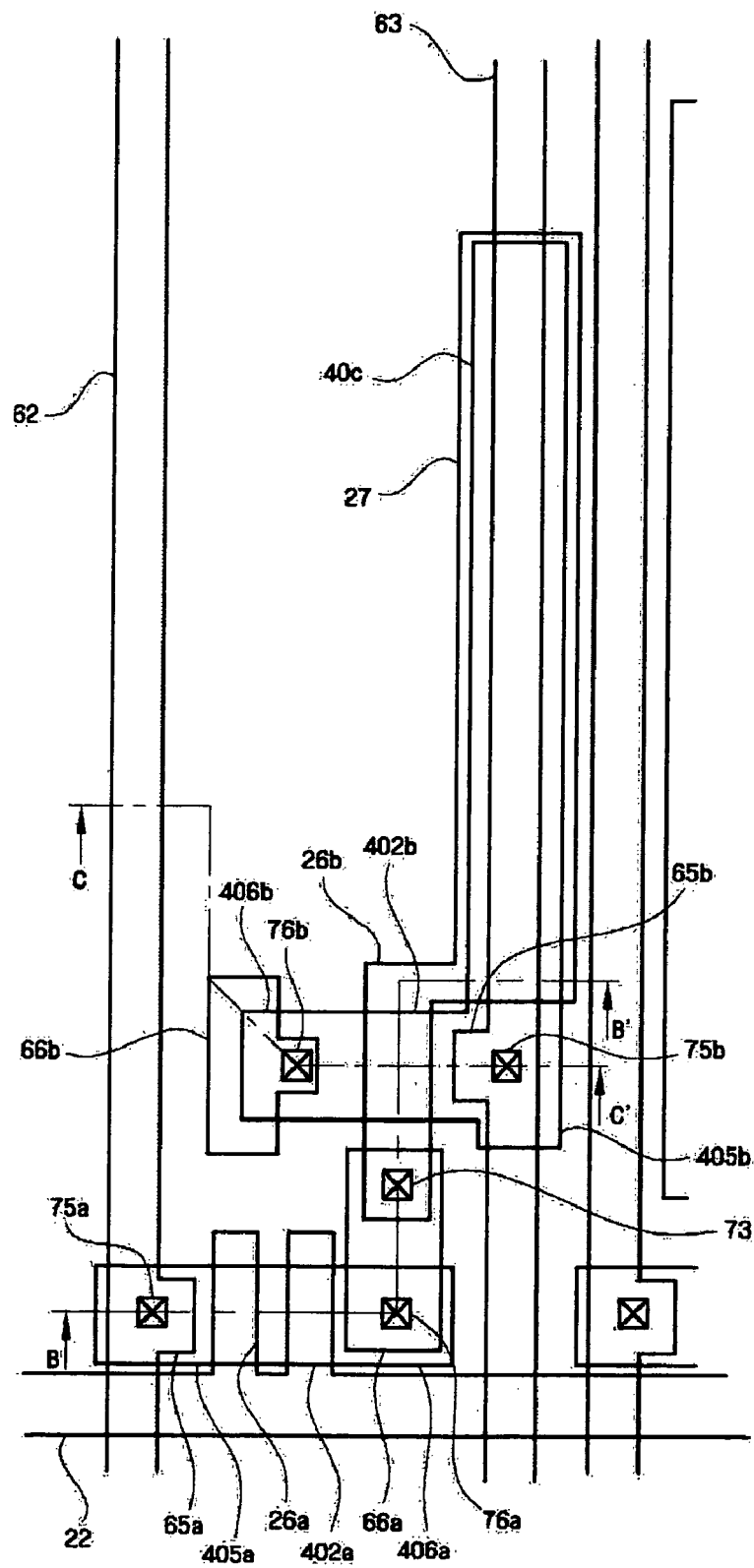
Figure 16B:
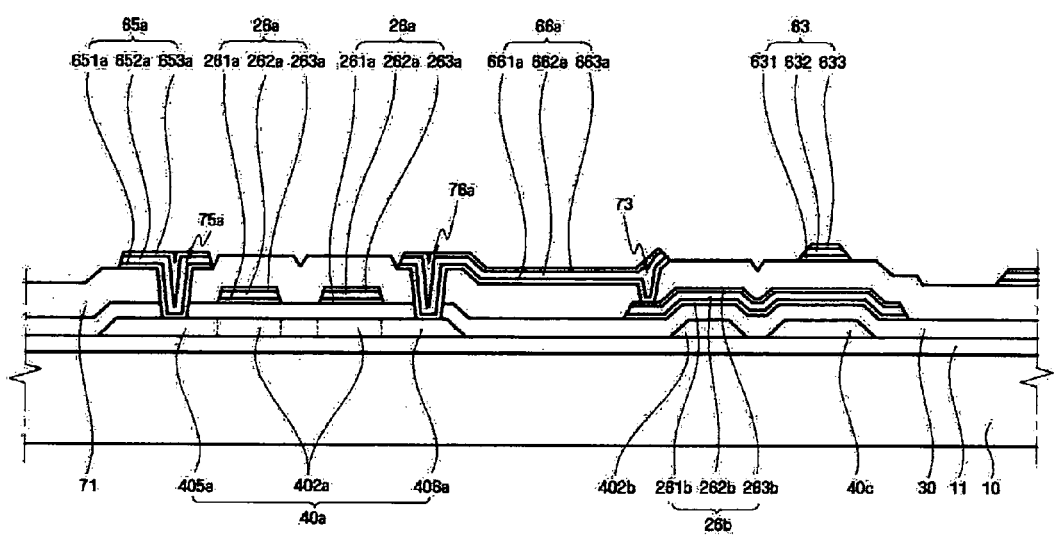
Figure 16C:
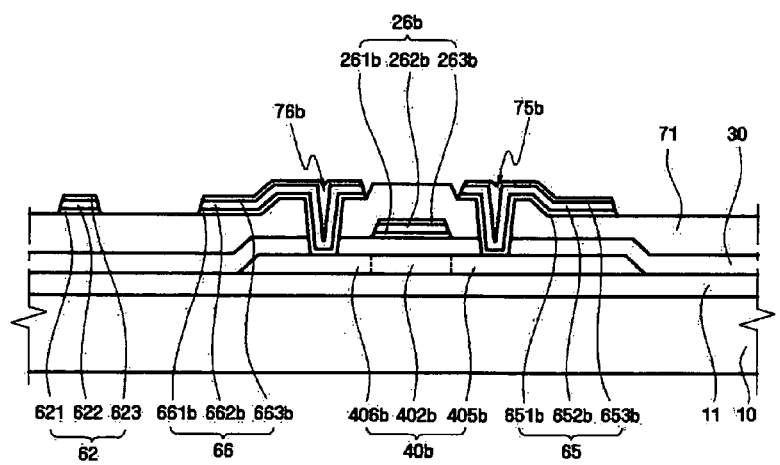

Referring to FIGS. 16A through 16C, data multi-layers are formed by sequentially depositing barrier layers 621, 631, 651a, 651b, 661a, and 661b including copper nitride, copper conductive layers 622, 632, 652a, 652b, 662a, and 662b including copper or a copper alloy, and capping layers 623, 633, 653a, 653b, 663a, and 663b on the semiconductor layers 40a and 40b exposed by the first interlayer insulating layer 71 and the contact holes 75a, 76a, 75b, and 76b using sputtering. Next, a photoresist pattern defining the data wires is formed on the data multi-layers and the capping layers 623, 633, 653a, 653b, 663a, and 663b, the copper conductive layers 622, 632, 652a, 652b, 662a, and 662b, and the barrier layers 621, 631, 651a, 651b, 661a, and 661b are sequentially etched or etched in a batch process using the photoresist pattern as an etching mask. Data wires are formed, including a data line 62 extending in a longitudinal direction, intersecting the gate line 22 to define a pixel, a driving voltage line 63 supplying a driving voltage, a first source electrode 65a connected to the first source region 405a through a contact hole 75a as a branch of the data line 62, a first drain electrode 66a spaced apart from the first source electrode 65a and connected to the first drain region 406a, a second source electrode 65b connected to the second source region 406a through a contact hole 75b as a branch of the driving voltage line 63, and a second rain electrode 66b spaced apart from the second source electrode 65b and connected to the second drain region 406b. The wire structure according to an embodiment of the present invention can be applied to the data wires 62, 63, 65a, 65b, 66a, and 66b. Therefore, the formed data wires 62, 63, 65a, 65b, 66a, and 66b including the copper conductive layers 622, 632, 652a, 652b, 662a, and 662b, as shown in FIGS. 5A and 5B, are well adhered to a substrate even after a patterning processing such as wet etching and the removal of a photoresist layer. In addition, the lateral profile of the wire structure has no overhang and has a good tapered angle. Thus, a top gate-type first TFT is formed, including the semiconductor layer 40a, the gate electrode 26a formed thereon, the source electrode 65a, and the drain electrode 66a where the gate electrode 26a is formed on the semiconductor layer 40a, and a top gate-type second TFT is formed, including the semiconductor layer 40b, the gate electrode 26b formed thereon, the source electrode 65b, and the drain electrode 66b where the gate electrode 26b is formed on the semiconductor layer 40b.

Figure 17A:
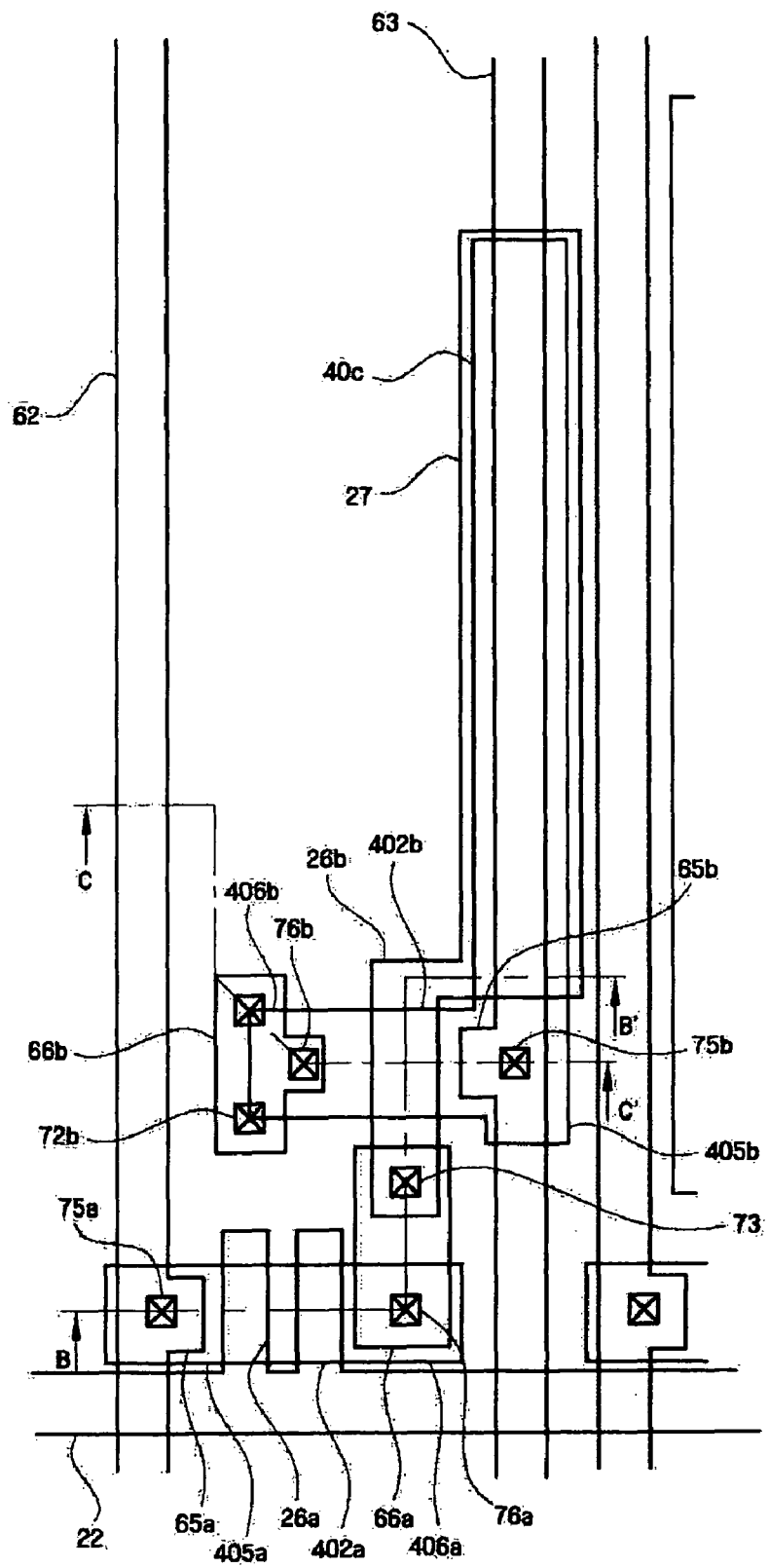
Figure 17B:
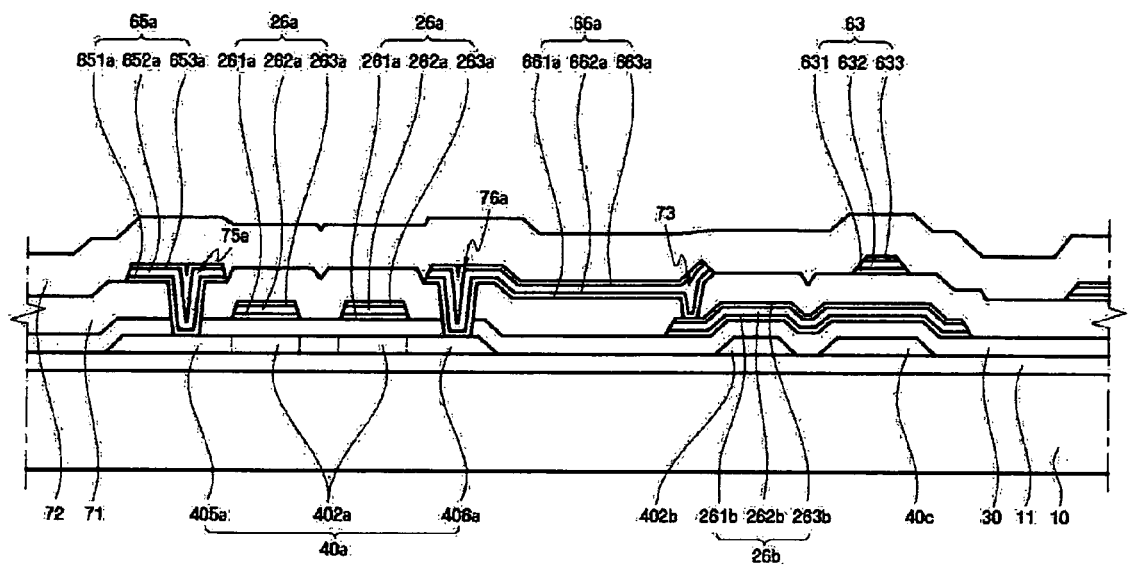
Figure 17C:
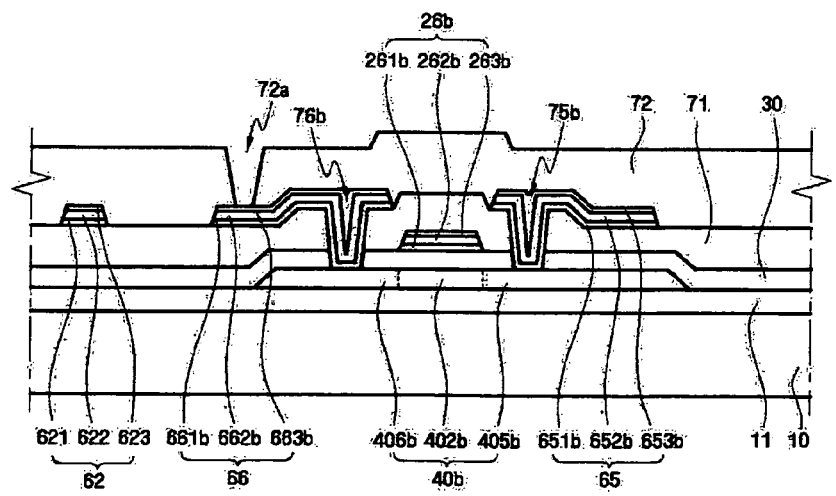

Next, as shown in FIGS. 17A through 17C, the second interlayer insulating layer 72 is deposited and patterned, thereby forming the contact hole 72b exposing the second drain electrode 66b.

Figure 18A:
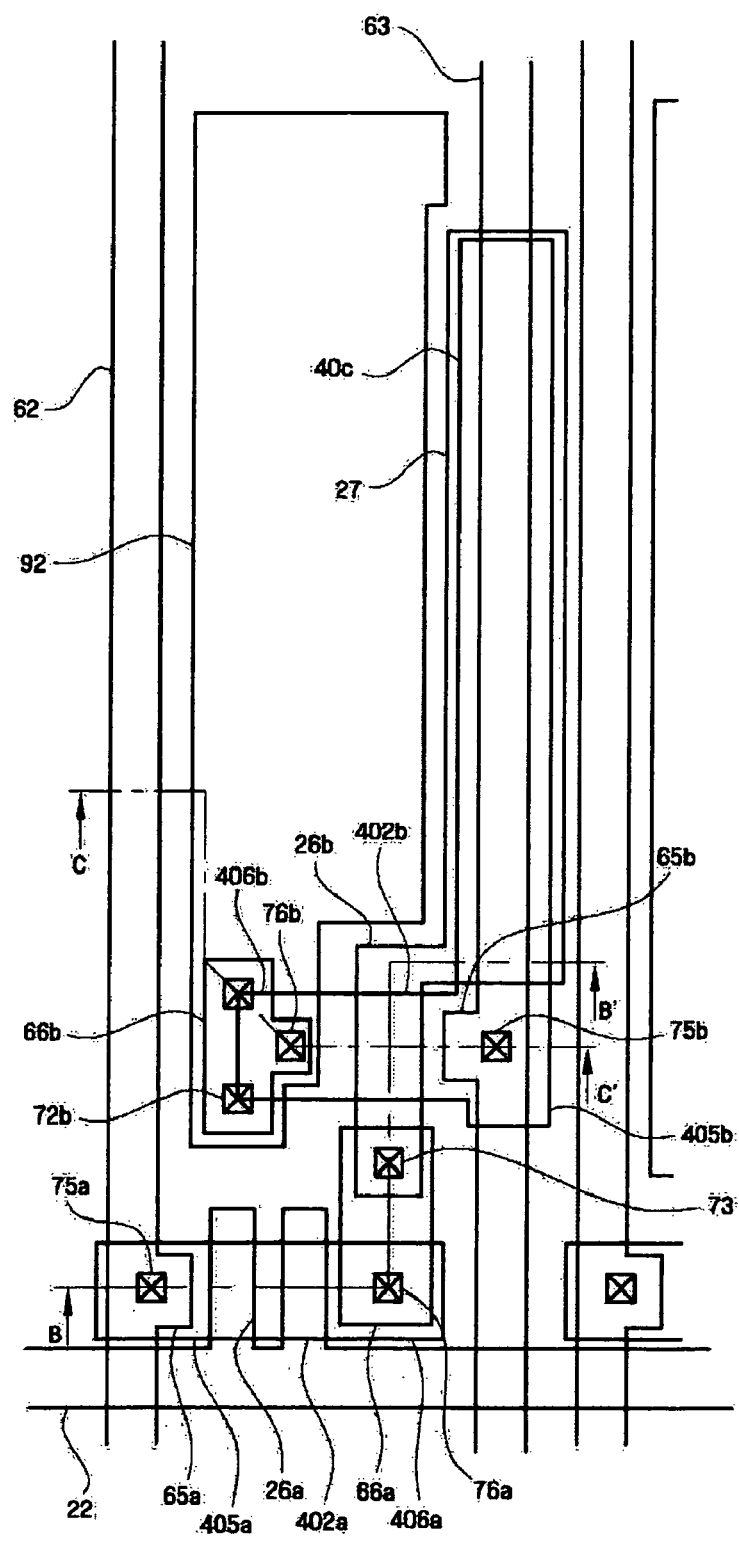
Figure 18B:
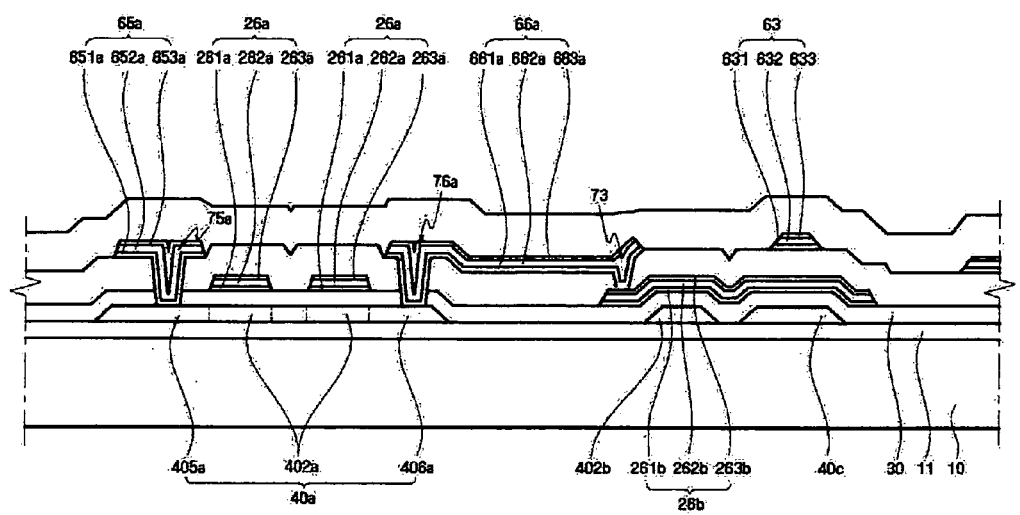
Figure 18C:
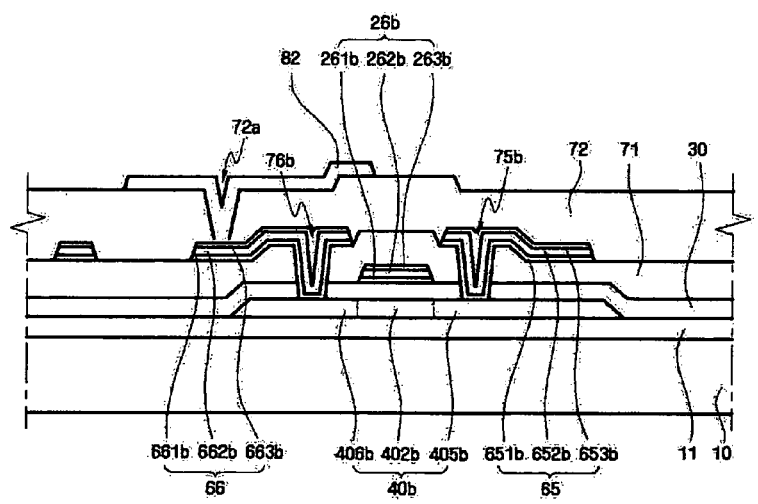

Next, as shown in FIGS. 18A through 18C, metal having superior reflectivity such as aluminum (or an aluminum alloy) or silver (or a silver alloy) is deposited and patterned, thereby forming the pixel electrode 82.

Next, as shown in FIGS. 12A through 12C, an organic layer including a black pigment is coated on the second interlayer insulating layer 72 where the pixel electrode 82 is formed and is then exposed and developed, thereby forming the partition wall 91 filling a region except for an organic light emitting space. Next, the organic light emitting layer 92 is formed in the organic light emitting space using deposition or inkjet printing.

Next, a conductive organic material is coated on the partition wall 91 and the organic light emitting layer 92, thereby forming the buffer layer 95. ITO or IZO is deposited on the buffer layer 95, thereby forming the common electrode 100. Here, the pixel electrode 82 is preferably made of a transparent conductive material such as ITO or IZO. In this case, the common electrode 100 may be made of made of a high reflectivity material such as Al (or Al alloy) or Ag (or Ag alloy).

While a triple-layered wire structure comprising a barrier layer including copper nitride in gate and data lines, a copper conductive layer including copper or a copper alloy, and a capping layer, has been described by way of example in the TFT substrates and the fabrication methods thereof according to several embodiments of the present invention, only one of the gate and data lines may have the triple-layered wire structure and the other may have a wire structure well known in the art or any other particular wire structure within the scope of the present invention.

While the TFT substrate according to an embodiment of the present invention and the fabrication method thereof that have been described above are applied to a bottom gate-type LCD by way of example, the invention is not limited thereto and can also be applied to an organic EL display. In this case, a pair of bottom gate-type TFTs are provided for each pixel as a switching TFT and a driving TFT, respectively. Meanwhile, although the TFT substrate according to another embodiment of the present invention and the fabrication method thereof that have been described above are applied to a top gate-type organic EL display by way of example, the invention is not limited thereto and can also be applied to a TFT substrate for an LCD having a TFT for each pixel. In this case, the top gate-type TFT LCD is preferably of a reflective type. In addition to the illustrated embodiments, the TFT substrate according to the present invention and the fabrication method thereof can be advantageously applied to an array on color filter (AOC) substrate having thin film transistors on a color filter. Further, the TFT substrate according to the present invention and the fabrication method thereof can be applied to a wide variety of TFT substrates, and a detailed explanation thereof is not given so as not to unnecessarily obscure aspects of the present invention.

As described above, in a wire structure and a method for fabricating a wire structure according to the present invention, adhesion of a copper conductive layer to a substrate is improved and a low-resistance copper wire having improved lateral profile and reliability can be obtained.

In addition, the method for fabricating the wire structure is simplified and processing efficiency is improved.

Further, in a TFT substrate and a method for fabricating the TFT substrate according to the present invention, superior reliability of gate wires and/or data wires can be ensured, thereby improving a signal characteristic, image quality, and processing efficiency.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A wire structure comprising:
    a barrier layer including copper nitride formed on a substrate;
    a conductive layer formed on the barrier layer, the conductive layer including copper or a copper alloy; and
    a capping layer formed on the conductive layer and including molybdenum or a molybdenum alloy,
    wherein the lateral profiles of the barrier layer, the conductive layer, and the capping layer have substantially the same taper angle, and
    wherein the barrier layer contacts with the substrate.

2. The wire structure of claim 1, wherein the thickness of the barrier layer is in a range of 50- 1000 Å.

3. The wire structure of claim 1, wherein the barrier layer includes nitrogen in an amount of 0.001-50 atomic percent.

4. The wire structure of claim 1, wherein the substrate is selected from materials consisting of a semiconductor layer, an insulating layer, or glass.

5. A thin film transistor (TFT) substrate comprising:
    gate wires including a gate line extending in a first direction and a gate electrode connected to the gate line on an insulating substrate;
    data wires insulated from the gate wires and including a data line extending in a second direction and intersecting the gate line, a source electrode connected to the data line, and a drain electrode spaced apart from the source electrode on the insulating substrate; and
    a pixel electrode connected to the drain electrode which is formed on the gate wire on the gate wires and the data wires,
    wherein the gate wires and/or the data wires include a barrier layer formed on a substrate and including copper nitride, a conductive layer formed on the barrier layer and including copper or a copper alloy, a capping layer formed on the conductive layer and including molybdenum or a molybdenum alloy, and
    wherein the lateral profiles of the barrier layer, the conductive layer, and the capping layer have substantially the same taper angle, and
    wherein the barrier layer contacts with the substrate.

6. The thin film transistor substrate of claim 5, wherein the thickness of the barrier layer is in a range of 50-1000 Å.

7. The thin film transistor substrate of claim 6, wherein the barrier layer includes nitrogen in an amount of 0.001-50 atomic percent.

* * * * *